(12) United States Patent
Park et al.

(10) Patent No.: US 10,521,033 B2
(45) Date of Patent: Dec. 31, 2019

(54) TOUCH SENSOR ASSEMBLY AND REFRIGERATOR DOOR INCLUDING SAME

(71) Applicant: LG ELECTRONICS INC., Seoul (KR)

(72) Inventors: Jinseung Park, Seoul (KR); Seungje Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/952,550

(22) Filed: Apr. 13, 2018

(65) Prior Publication Data

US 2018/0232073 A1    Aug. 16, 2018

Related U.S. Application Data

(63) Continuation of application No. 14/977,615, filed on Dec. 21, 2015, now Pat. No. 10,055,038.

(30) Foreign Application Priority Data

Dec. 24, 2014  (KR) .......................... 10-2014-0188229

(51) Int. Cl.
*G06F 3/041* (2006.01)
*F25D 23/02* (2006.01)
(Continued)

(52) U.S. Cl.
CPC ............ *G06F 3/041* (2013.01); *F25D 23/02* (2013.01); *H03K 17/9643* (2013.01); *F25D 29/005* (2013.01); *H03K 2217/96015* (2013.01)

(58) Field of Classification Search
CPC .................................. F25D 23/02; G06F 3/041
See application file for complete search history.

(56) References Cited

U.S. PATENT DOCUMENTS

| 3,935,485 A | 1/1976 | Yoshida et al. |
| 4,056,699 A | 11/1977 | Jordan |

(Continued)

FOREIGN PATENT DOCUMENTS

| CN | 1255665 | 6/2000 |
| CN | 1980061 | 6/2007 |

(Continued)

OTHER PUBLICATIONS

European Search Report dated Jun. 19, 2018 issued in Application No. 18158905.2.

(Continued)

*Primary Examiner* — Kent W Chang
*Assistant Examiner* — Chayce R Bibbee
(74) *Attorney, Agent, or Firm* — Ked & Associates LLP

(57) ABSTRACT

A touch sensor assembly according to an embodiment of the present disclosure includes a sensor housing disposed at a rear surface of an external member on which a touch operation unit on which a user touches is marked, a sensor PCB accommodated in the sensor housing, and an elastic member which is disposed at a rear side of the sensor PCB and presses the sensor PCB toward a rear surface of the external member, wherein the elastic member is mounted in an elastic member accommodation portion formed at a bottom surface of the sensor housing.

21 Claims, 31 Drawing Sheets

(51) Int. Cl.
*H03K 17/96* (2006.01)
*F25D 29/00* (2006.01)

(56) References Cited

U.S. PATENT DOCUMENTS

| | | |
|---|---|---|
| 5,239,152 A | 8/1993 | Caldwell et al. |
| 5,780,530 A | 7/1998 | Mizutani et al. |
| 5,923,522 A | 7/1999 | Sajna |
| 5,973,420 A | 10/1999 | Kaiserman et al. |
| 5,995,877 A | 11/1999 | Brueggemann et al. |
| 6,242,076 B1 | 6/2001 | Andriash |
| 6,265,682 B1 | 7/2001 | Lee |
| 6,421,253 B1 | 7/2002 | Ash, Jr. |
| 6,663,111 B1 * | 12/2003 | Freiseisen ............ F16L 37/48 277/602 |
| 6,667,563 B2 | 12/2003 | Bae et al. |
| 7,155,317 B1 | 12/2006 | Tran |
| 7,208,960 B1 | 4/2007 | Deangelis |
| 7,573,701 B2 | 8/2009 | Doberstein et al. |
| 7,869,589 B2 | 1/2011 | Tuovinen |
| 7,911,321 B2 | 3/2011 | Bingle et al. |
| 8,320,131 B2 | 11/2012 | Paleczny et al. |
| 8,371,551 B2 | 2/2013 | Jang |
| 8,384,679 B2 | 2/2013 | Paleczny et al. |
| 8,648,832 B2 | 2/2014 | Maloof et al. |
| 8,742,647 B2 | 6/2014 | Fluhrer |
| 8,922,979 B2 | 12/2014 | Fluhrer |
| 9,323,289 B2 | 4/2016 | Oohira |
| 9,448,628 B2 | 9/2016 | Tan et al. |
| 10,006,625 B2 | 6/2018 | Kim et al. |
| 10,007,385 B2 | 6/2018 | Kim |
| 2002/0066971 A1 | 6/2002 | Takashi |
| 2003/0043449 A1 | 3/2003 | Takeuchi et al. |
| 2004/0011556 A1 | 1/2004 | Toril |
| 2004/0100479 A1 | 5/2004 | Nakano et al. |
| 2004/0231884 A1 | 11/2004 | Wong et al. |
| 2006/0177212 A1 | 8/2006 | Lamborghini et al. |
| 2006/0262549 A1 | 11/2006 | Schmidt et al. |
| 2007/0051459 A1 | 3/2007 | Yamano |
| 2007/0051610 A1 | 3/2007 | Weiss |
| 2007/0130965 A1 | 6/2007 | Boarman et al. |
| 2007/0246267 A1 | 10/2007 | Koottungal |
| 2008/0143684 A1 | 6/2008 | Seo |
| 2008/0165154 A1 | 7/2008 | Kim |
| 2008/0196945 A1 | 8/2008 | Konstas |
| 2008/0202912 A1 | 8/2008 | Boddie et al. |
| 2008/0257706 A1 | 10/2008 | Haag |
| 2009/0090605 A1 | 4/2009 | Arione et al. |
| 2009/0107829 A1 | 4/2009 | Heimann |
| 2009/0128375 A1 | 5/2009 | Heimann et al. |
| 2009/0306827 A1 | 12/2009 | Kim et al. |
| 2009/0322700 A1 | 12/2009 | D'Souza et al. |
| 2010/0007531 A1 | 1/2010 | Fluhrer |
| 2010/0045617 A1 * | 2/2010 | Lee ................ F25D 29/005 345/173 |
| 2010/0114011 A1 | 5/2010 | Herrmann |
| 2010/0149000 A1 | 6/2010 | Heimann |
| 2010/0216929 A1 | 8/2010 | Jung et al. |
| 2010/0219176 A1 | 9/2010 | Striegler |
| 2011/0032199 A1 | 2/2011 | Seo et al. |
| 2011/0048047 A1 * | 3/2011 | Kim ................ F25D 29/005 62/246 |
| 2011/0134627 A1 | 6/2011 | Hamlin et al. |
| 2011/0175845 A1 | 7/2011 | Honda et al. |
| 2011/0267304 A1 | 11/2011 | Simmons et al. |
| 2011/0299129 A1 | 12/2011 | Ishida et al. |
| 2012/0063108 A1 | 3/2012 | Kim et al. |
| 2012/0138336 A1 | 6/2012 | Watanabe et al. |
| 2012/0138337 A1 | 6/2012 | Kim |
| 2012/0274602 A1 | 11/2012 | Bita et al. |
| 2013/0021274 A1 | 1/2013 | Fukushima et al. |
| 2013/0067940 A1 | 3/2013 | Shim |
| 2013/0082948 A1 | 4/2013 | Ok |
| 2013/0126325 A1 | 5/2013 | Curtis et al. |
| 2013/0147751 A1 | 6/2013 | Alaman Aguilar et al. |
| 2014/0101589 A1 | 4/2014 | Hyun et al. |
| 2014/0184577 A1 | 7/2014 | Kim et al. |
| 2014/0203863 A1 | 7/2014 | Gillespie |
| 2014/0300263 A1 * | 10/2014 | Sung ................ G06F 3/044 312/404 |
| 2015/0002451 A1 | 1/2015 | Um |
| 2015/0192352 A1 | 7/2015 | Sung et al. |
| 2015/0276302 A1 | 10/2015 | Roh et al. |
| 2015/0378514 A1 | 12/2015 | Keski-Jaskari |
| 2016/0003519 A1 | 1/2016 | Kim et al. |
| 2016/0105985 A1 | 4/2016 | Wang et al. |
| 2016/0117022 A1 | 4/2016 | Kim et al. |
| 2016/0178277 A1 | 6/2016 | Park |
| 2016/0205765 A1 | 7/2016 | Takagi |
| 2017/0089633 A1 | 3/2017 | Kim et al. |

FOREIGN PATENT DOCUMENTS

| | | |
|---|---|---|
| CN | 101535748 | 9/2009 |
| CN | 101738051 | 6/2010 |
| CN | 101741371 | 6/2010 |
| CN | 101939605 | 1/2011 |
| CN | 102338544 | 2/2012 |
| CN | 202582565 U | 12/2012 |
| CN | 103105979 | 5/2013 |
| CN | 103109135 | 5/2013 |
| CN | 105546930 | 5/2016 |
| CN | 105577156 | 5/2016 |
| DE | 297 22 565 U1 | 2/1998 |
| DE | 10 2009 001 412 | 9/2010 |
| EP | 2 770 638 | 8/2014 |
| EP | 2 789 943 | 10/2014 |
| EP | 2 975 345 | 1/2016 |
| EP | 3 007 361 | 4/2016 |
| JP | S 58-014433 | 1/1983 |
| JP | H 06-095803 | 4/1994 |
| JP | H 06-060031 U | 8/1994 |
| JP | 2006-250485 | 9/2006 |
| JP | 2007-100995 | 4/2007 |
| JP | 2010-230226 | 10/2010 |
| JP | 2011-090897 | 5/2011 |
| JP | 2012-098828 | 5/2012 |
| JP | 2013-057432 | 3/2013 |
| JP | 2013-072581 | 4/2013 |
| JP | 2013-530398 | 7/2013 |
| JP | 2013-181734 | 9/2013 |
| JP | 2014-031958 | 2/2014 |
| JP | 2014-031978 | 2/2014 |
| JP | 2014-040939 | 3/2014 |
| JP | 2014-055700 | 3/2014 |
| JP | 2014-085024 | 5/2014 |
| JP | 2014-137147 | 7/2014 |
| JP | 2014-196933 | 10/2014 |
| KR | 10-2000-0031593 | 6/2000 |
| KR | 10-0578400 | 5/2006 |
| KR | 10-2006-0095696 | 9/2006 |
| KR | 10-0634365 | 10/2006 |
| KR | 10-0663866 | 1/2007 |
| KR | 10-0756451 | 9/2007 |
| KR | 10-2008-0045044 | 5/2008 |
| KR | 10-0866342 | 10/2008 |
| KR | 10-2009-0090518 | 8/2009 |
| KR | 10-2010-0050190 | 5/2010 |
| KR | 10-2010-0074034 | 7/2010 |
| KR | 10-2010-0095274 | 8/2010 |
| KR | 10-1132463 | 3/2012 |
| KR | 10-2012-0048655 | 5/2012 |
| KR | 10-2012-0050070 | 5/2012 |
| KR | 10-2012-0116207 | 10/2012 |
| KR | 10-1237564 | 2/2013 |
| KR | 10-2013-0040058 | 4/2013 |
| KR | 10-2014-0121753 | 10/2014 |
| WO | WO 2008/069352 | 6/2005 |
| WO | WO 2007/105950 | 9/2007 |
| WO | WO 2009/104859 | 8/2009 |
| WO | WO 2010/015749 | 2/2010 |
| WO | WO 2011/081279 | 7/2011 |
| WO | WO 2014/034434 | 3/2014 |
| WO | WO 2014/168391 | 10/2014 |

(56) References Cited

FOREIGN PATENT DOCUMENTS

| WO | WO 2014/208585 | 12/2014 |
|---|---|---|
| WO | WO 2015/128990 | 9/2015 |
| WO | WO 2016/072802 | 5/2016 |

OTHER PUBLICATIONS

European Search Report dated Jun. 20, 2018 issued in Application No. 15856232.2.
Chinese Office Action dated Jul. 27, 2018 issued in Application No. 201580024096.8 (with English translation).
United States Office Action dated Aug. 30, 2018 issued in U.S. Appl. No. 15/952,941.
United States Office Action dated Aug. 8, 2018 issued in U.S. Appl. No. 14/931,776.
United States Notice of Allowance dated Aug. 29, 2018 issued in U.S. Appl. No. 14/977,605.
International Search Report dated Mar. 2, 2016 issued in Application No. PCT/KR2015/011956 (full English text).
Korean Office Action dated Mar. 30, 2018 issued in Application No. 10-2016-7034720.
United States Office Action dated Apr. 24, 2018 issued in U.S. Appl. No. 15/305,261.
Korean Office Action dated Nov. 9, 2015 issued in Application No. 10-2014-0154781.
Korean Office Action dated Dec. 18, 2015 issued in Application No. 10-2014-0145534.
Korean Office Action dated Jan. 28, 2016 issued in Application No. 10-2014-0189150.
Korean Office Action dated Mar. 9, 2016 issued in Application No. 10-2015-0063758.
European Search Report dated Mar. 22, 2016 issued in Application No. 15192563.3.
Korean Office Action dated Apr. 4, 2016 issued in Application No. 10-2014-0186531.
European Search Report dated Apr. 25, 2016 issued in Application No. 15200775.3.
European Search Report dated May 13, 2016 issued in Application No. 15201205.0.
European Search Report dated May 3, 2016 issued in Application No. 15201832.1.
European Search Report dated May 31, 2016 issued in Application No. 15191174.0.
European Search Report dated Jun. 15, 2016 issued in Application No. 15201840.4.
Korean Office Action dated Jul. 18, 2016 issued in Application No. 10-2015-0167689.
Korean Notice of Allowance dated Aug. 31, 2016 issued in Application No. 10-2014-0186531.
Korean Notice of Allowance dated Aug. 31, 2016 issued in Application No. 10-2014-0189144.
Australian Office Action dated Aug. 22, 2016 issued in Application No. 2016201233.
Korean Notice of Allowance dated Sep. 13, 2016 issued in Application No. 10-2014-0189150.
European Search Report dated Sep. 19, 2016 issued in Application No. 16161569.5.
Korean Notice of Allowance dated Sep. 30, 2016 issued in Application No. 10-2014-0188229.
United States Office Action dated Mar. 24, 2017 issued in U.S. Appl. No. 14/931,776.
Korean Office Action dated Jan. 31, 2017 issued in Application No. 10-2015-0167689.
Korean Notice of Allowance dated Apr. 6, 2017 issued in Application No. 10-2015-0167689.
United States Office Action dated May 19, 2017 issued in U.S. Appl. No. 14/977,623.
United States Final Office Action dated Sep. 5, 2017 issued in co-pending U.S. Appl. No. 14/931,776.
Chinese Office Action dated Jul. 3, 2017 issued in Application No. 201510671495.5 (with English translation).
Chinese Office Action dated Jul. 3, 2017 issued in Application No. 201510684487.4 (with English translation).
United States *Ex Parte Quayle* Action dated Sep. 28, 2017 issued in U.S. Appl. No. 14/977,623.
United States Office Action dated Oct. 5, 2017 issued in U.S. Appl. No. 14/921,681.
United States Office Action dated Oct. 5, 2017 issued in U.S. Appl. No. 14/977,615.
Chinese Office Action dated Sep. 29, 2017 issued in Application No. 201510977160.6 (with English translation).
Chinese Office Action dated Oct. 25, 2017 issued in Application No. 201510977666.2 (with English translation).
United States Office Action dated Nov. 17, 2017 issued in U.S. Appl. No. 14/977,605.
Japanese Office Action dated Dec. 12, 2017 issued in Application No. 2017-527531.
Chinese Office Action dated Jan. 17, 2018 issued in Application No. 201510964492.0.
Chinese Office Action dated Jan. 25, 2018 issued in Application No. 201510979959.9.
United States Office Action dated Feb. 28, 2018 issued in U.S. Appl. No. 14/931,776.
United States *Ex Parte Quayle* Office Action dated Feb. 28, 2018 issued in U.S. Appl. No. 14/977,572.
United States Office Action dated May 25, 2018 issued in U.S. Appl. No. 14/977,605.
United States Office Action dated Jul. 25, 2018 issued in U.S. Appl. No. 14/977,588.
U.S. Office Action dated Feb. 5, 2019 issued in U.S. Appl. No. 14/977,588.
United States Office Action dated Apr. 23, 2019 issued in co-pending related U.S. Appl. No. 15/358,226.
United States Office Action dated Jan. 11, 2019 issued in U.S. Appl. No. 16/199,992.
U.S. Office Action dated Jun. 7, 2019 issued in U.S. Appl. No. 16/199,992.
U.S. Office Action dated Jun. 28, 2019 issued in U.S. Appl. No. 16/433,631.
European Office Action dated Sep. 18, 2018 issued in Application No. 15 191 174.0.
U.S. Notice of Allowance issued in U.S. Appl. No. 16/199,992 dated Oct. 8, 2019.

\* cited by examiner

TOUCH SENSOR ASSEMBLY AND REFRIGERATOR DOOR INCLUDING SAME

CROSS-REFERENCE TO RELATED APPLICATIONS

This application is a Continuation Application of prior U.S. patent application Ser. No. 14/977,615 filed Dec. 21, 2015, which claims priority under 35 U.S.C. § 119 to Korean Application No. 10-2014-0188229 filed on Dec. 24, 2014, whose entire disclosures are hereby incorporated by reference.

BACKGROUND

1. Field

A touch sensor assembly for household appliances and a refrigerator door including the same are disclosed herein.

2. Background

Generally, touch sensor assemblies are used for household appliances and may include electrostatic capacitance sensors or sensors using a resistance cell, etc. Such sensors sense a user's touches, and perform a signal processing for operation of household appliances. Steel, an exterior member coated to have feeling of steel, or glass has been widely used for an exterior member, and a touch sensor assembly has been developed to easily recognize a touch when a user touches a surface of such an exterior member.

Refrigerators are household appliances for storing food in inner storage spaces at low temperatures. The refrigerator is configured to store stored food in an optimum state by cooling an inside thereof using chill air generated by heat exchanging with a refrigerant which circulates a refrigeration cycle. The inside of the refrigerator may be divided into a refrigerator compartment and a freezer compartment, and a storage member, such as a shelf, a drawer, and a basket, is provided in the inside of the refrigerator compartment and/or the freezer compartment. The refrigerator and the freezer compartments are covered by doors. The refrigerator may be classified according to arrangement of the refrigerator compartment and the freezer compartment and a shape of the door.

Recently, refrigerators which include improved exteriors and various comfort systems according to trends toward gentrification and multifunction are commercialized. For example, refrigerators of which exterior members which constitute exteriors thereof are formed of steel, glass, or a material which is formed by being coated with a glass-like material and which include displays and operation systems having various structures for easy user manipulation have been developed. A refrigerator developed based on above technique is disclosed in the Korean Patent No. 10-0634365, whose disclosure is incorporated herein by reference.

SUMMARY

An embodiment of the present disclosure is directed to providing a touch sensor assembly which maintains a state in which the touch sensor assembly is pressed against an exterior member, and accurately senses a movement displacement of the exterior member generated at a moment of a touch operation of the exterior member, and whose recognition rate is improved.

A touch sensor assembly according to an embodiment of the present disclosure includes a sensor housing disposed on a rear surface of an external member on which a touch operation unit touched by a user is marked, a sensor PCB accommodated in the sensor housing, and an elastic member which is disposed at the rear of the sensor PCB and presses the sensor PCB toward a rear surface of the external member, wherein the elastic member is mounted in an elastic member accommodation portion formed on a bottom surface of the sensor housing.

In addition, a refrigerator door according to an embodiment of the present disclosure includes a front panel, a door liner, a decor member, and a touch sensor assembly mounted on a rear surface of the front panel, wherein the touch sensor assembly includes a sensor housing disposed on the rear surface of the front panel, a sensor PCB accommodated in the sensor housing, and an elastic member which is disposed at the rear of the sensor PCB and presses the sensor PCB toward the rear surface of the external member, and the elastic member is mounted in the elastic member accommodation portion formed on a bottom surface of the sensor housing.

According to an embodiment of the present disclosure, the touch sensor has a structure in which edges thereof are supported by outer sides of a sensor support portion, and a center thereof is not supported. Accordingly, when a displacement generated when a user touches an operation unit marked on an exterior member or a front panel is transferred to the touch sensor, a force which pushes the touch sensor may be concentrated in the center of the touch sensor, and the touch sensor can effectively sense the push operation on the operation unit.

That is, since the sensor support portion supports the edges of the touch sensor, a ceramic material disposed at the center of the touch sensor is easily elastically deformed, and thus, an effect that a sensitivity of the touch sensor is improved can be expected.

In addition, a state in which an operation recognition portion of a touch sensor assembly is pressed against the exterior member or the front panel is maintained by an elastic member. Accordingly, a movement displacement of the exterior member or the front panel generated when a user touches the exterior member or the front panel, that is, the amount of displacement, may be accurately sensed, and there is an effect that the touch recognition rate of a user's touch operation is improved.

Particularly, the elastic member may include a support portion and an extension portion, and may stably support edges of the touch sensor. That is, when touch pressure is applied, a phenomenon that the touch sensor is inclined in one direction may be prevented.

In addition, the elastic member may be fixedly mounted using a method of press-fitting the elastic member into a housing, and not only a process of coating an additional adhesive may be omitted, but also there may be a merit that a sensitivity failure of the touch sensor which occurs when the elastic member is separated from an installation position and is disposed at an incorrect position may be prevented.

In addition, a sensor controller which processes an operation signal of the touch sensor assembly is separated from the touch sensor assembly, and is provided at a display assembly installed after a process in which foam for forming a door is foamed. Accordingly, there is an effect that damage of the touch sensor assembly due to static electricity generated while the door is manufactured is prevented. Moreover, since a state in which a portion touched by a user is spaced a sufficient distance from the sensor controller is maintained, there is a merit that damage of the sensor controller due to static electricity generated during a touch is prevented.

In addition, since a display cover in which the touch sensor assembly is installed is attached to a rear surface of the front panel, and the display assembly is inserted into and installed inside a door through an insertion hole formed at a decor member, there is a merit that a structure of a front side of the door is improved.

In addition, since alignment is performed so that the display cover is mounted at a correct position, and a light source of a display passes through a display window, effects that recognizability of the display window is improved and the structure of the front side of the door is also improved, can also be expected.

BRIEF DESCRIPTION OF THE DRAWINGS

Embodiments will be described in detail with reference to the following drawings in which like reference numerals refer to like elements, and wherein.

DETAILED DESCRIPTION

Embodiments of the present disclosure may be described using a touch sensor assembly installed to a door of a side by side-type refrigerator. However, the present disclosure may also be applied to other household appliances including refrigerators to which control commands are input by touching an exterior member thereof.

Figure 1:
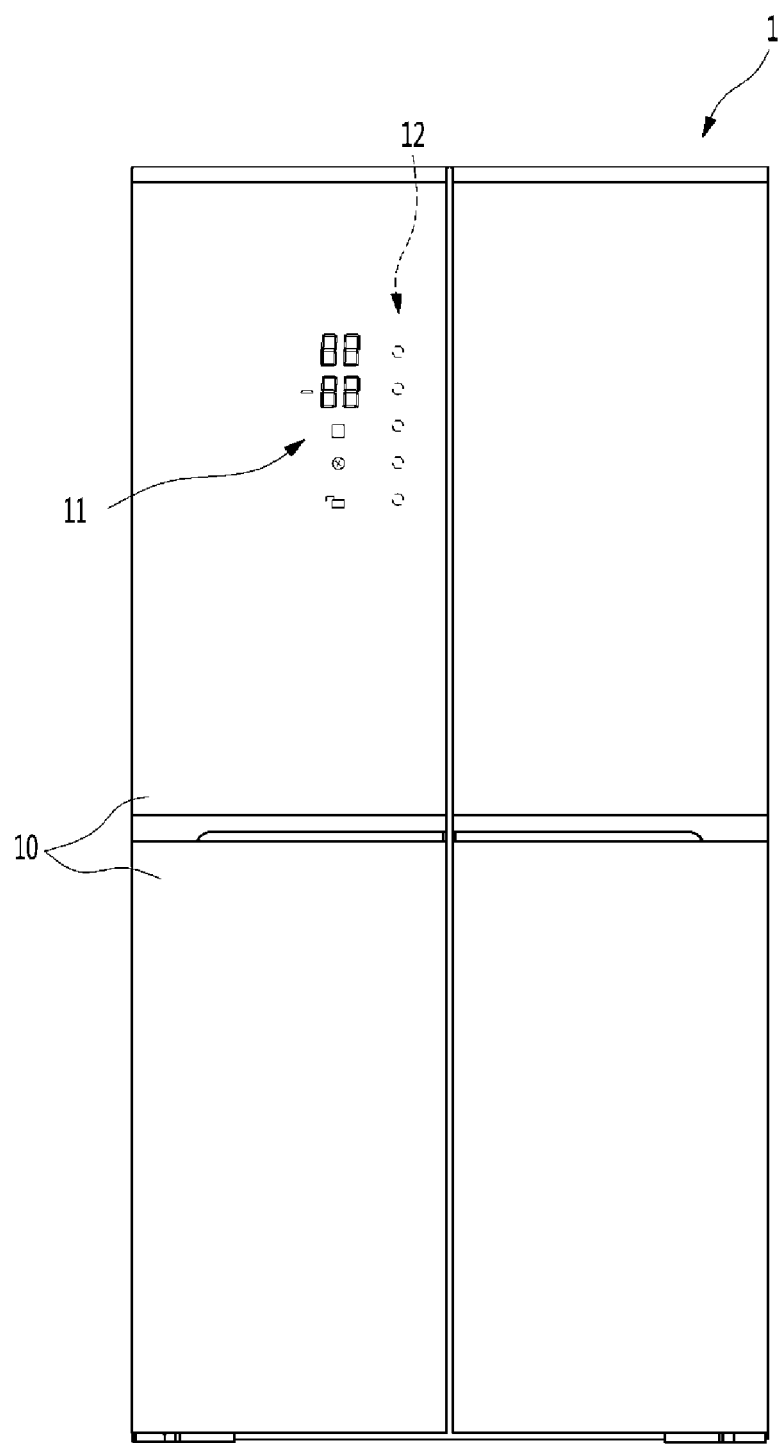
FIG. 1 is a front view illustrating a refrigerator according to an embodiment of the present disclosure.

FIG. 1 is a front view illustrating a refrigerator according to an embodiment of the present disclosure. A refrigerator 1 may include cabinets forming storage spaces, and doors 10 which are installed at the cabinets, and open or close the storage space. The storage spaces may be partitioned horizontally and/or vertically, and a plurality of doors 10 which respectively open or close the storage spaces may be provided at opened front sides of the storage spaces. The doors 10 are configured to open or close the storage spaces using a sliding or pivoting method, and are configured to form a front side exterior of the refrigerator 1 in a state in which the doors are closed.

A display window 11 (or display area) and a touch operation unit or touch input area 12 may be provided on any one door 10 of the plurality of doors 10. The display window 11 and the touch operation unit 12 may be provided at a height easy to operate and recognize content or information shown in the display window 11.

The display window 11 is a means to show operation states of the refrigerator 1 to the outside, displays symbols or numerals when light emitted from an inside of the door 10 transmits toward an outside of the door 10, and enables a user to confirm such information from the outside.

The touch operation unit or touch input area 12 may allow a user to perform a touch operation to set an operating condition of the refrigerator 1, and may be provided on a partial region of the front surface of the door 10. In addition, a portion or a region in which a user's push operation is sensed or allow an indication for a user to provide touch input may be formed using a surface processing including a printing or an etching.

Figure 2:
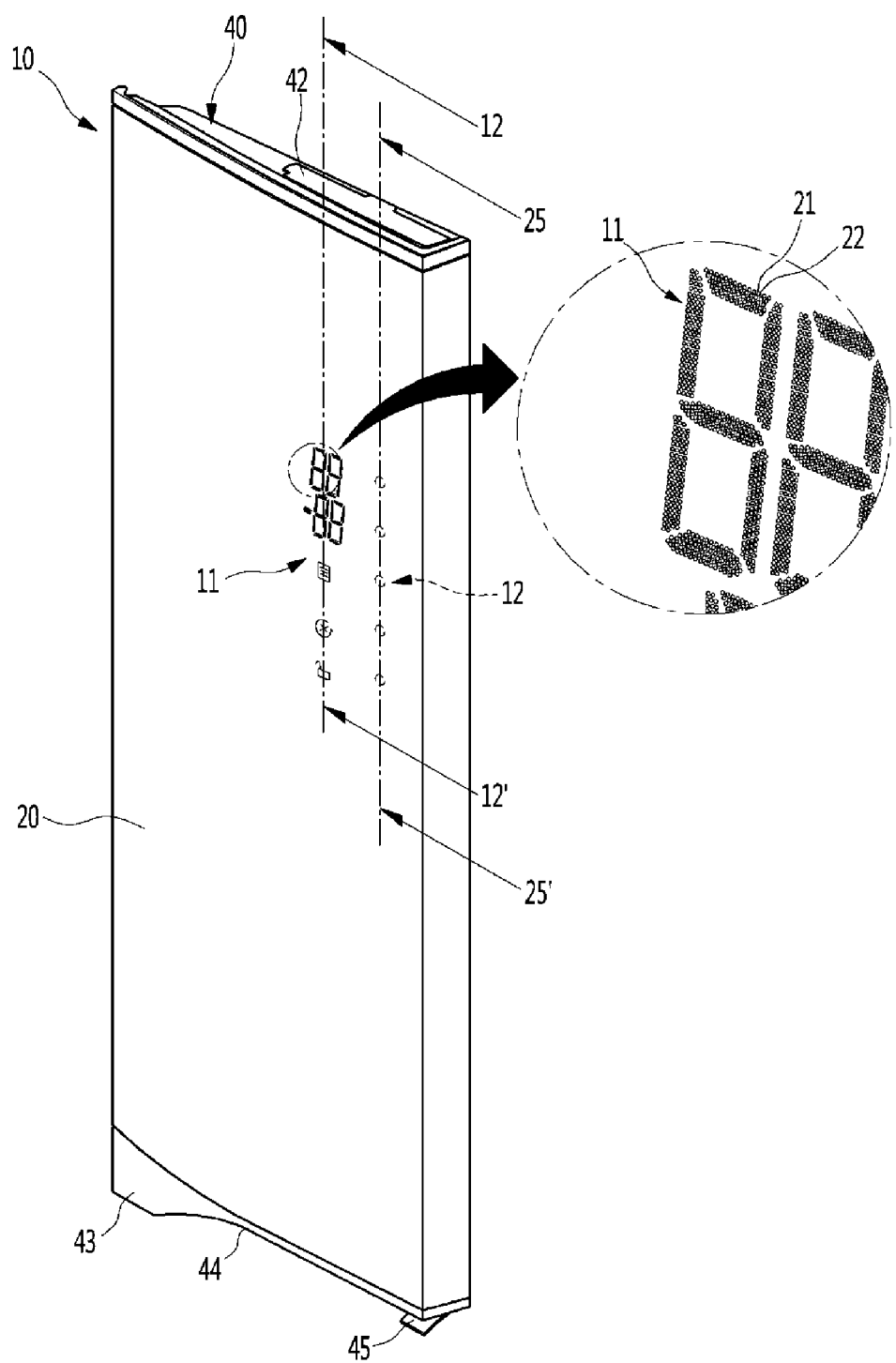
FIG. 2 is a perspective view illustrating a door according to an embodiment of the present disclosure.
Figure 3:
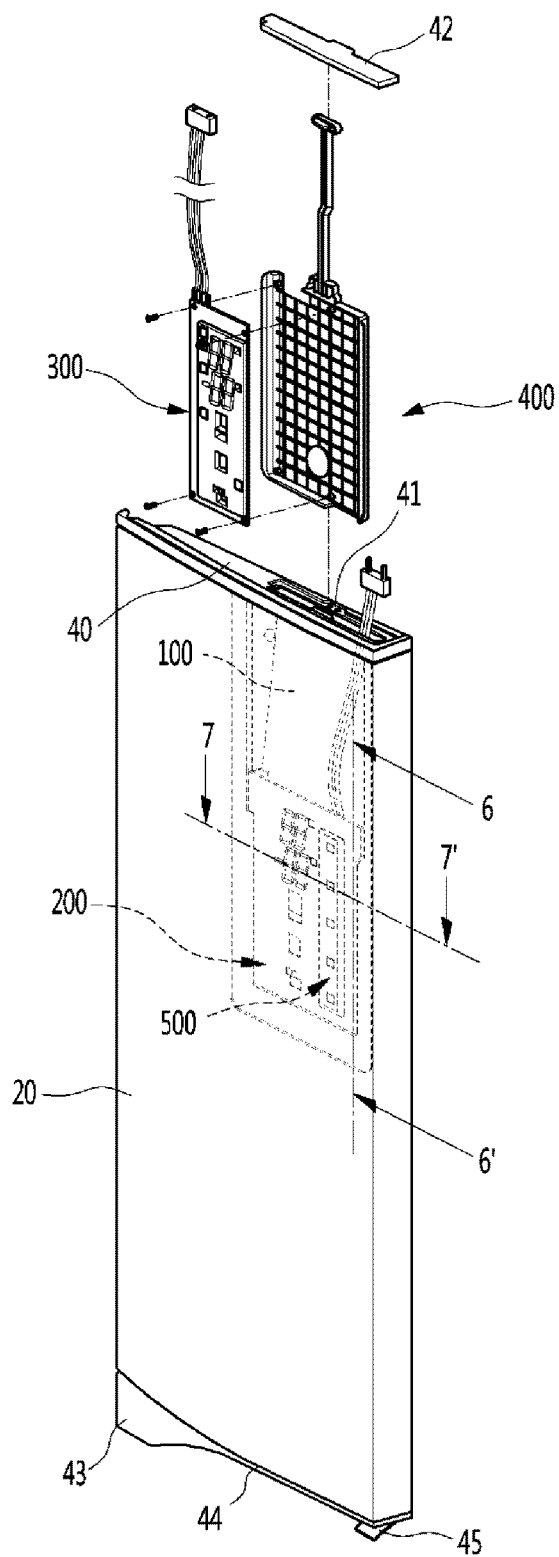
FIG. 3 is an exploded perspective view illustrating a shape in which a display assembly is installed in the door.
Figure 4:
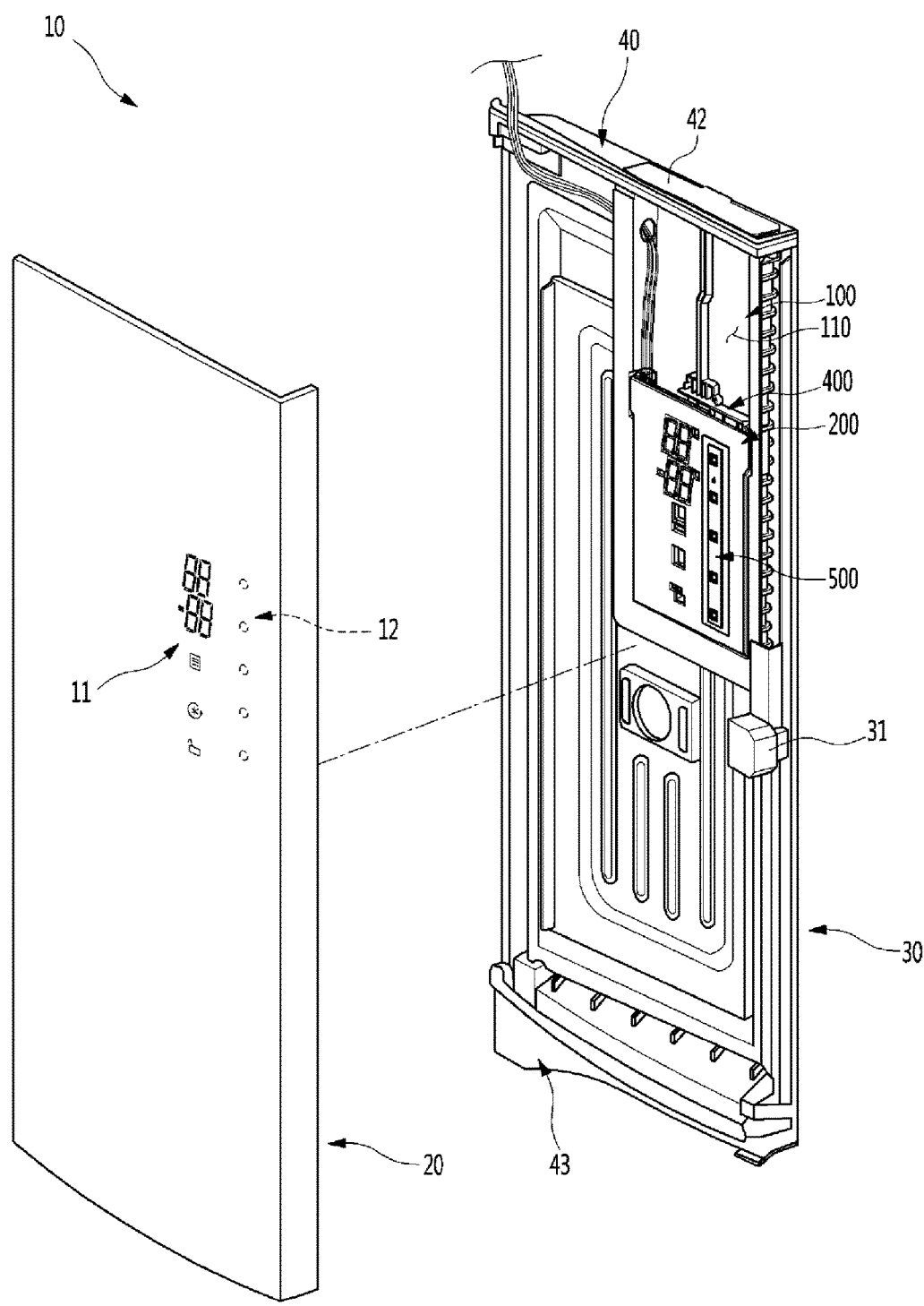
FIG. 4 is an exploded perspective view illustrating a shape in which a front panel of the door is separated.

Referring to FIGS. 2 to 4, the door 10 may include a front panel 20 which defines a front side exterior of the door 10, deco members 40 and 43 (or door trim) provided at upper and lower ends of the front panel 20, and a door liner 30 which defines a rear side exterior of the door 10. The front panel 20 forms the front side exterior of the door 10, and may be formed of a stainless steel having a plate shape. The front panel 20 may also be formed of a different metal, or a material having the same look and feel a metal, or may be formed of glass or plastic as necessary. An anti-fingerprint processing or hairline processing may be further performed at a front surface of the front panel 20.

The display window 11 may be defined by a plurality of first through holes 21 disposed at a partial region of the front panel 20. The display window 11 may be defined as a set of the plurality of first through holes 21 perforated at compact intervals to display numerals or symbols. For example, the set of the plurality of first through holes 21 may be disposed in seven segments (or eighty eight segments) shape, and may also be formed in a specific symbol, image, pattern, or character shape which may show an operating condition or operation state of the refrigerator 1.

The display window 11 is formed at a position corresponding to second through holes 220 and third through holes 321 (see FIG. 5) which will be described below, and is formed so that light emitted from a light-emitting diode (LED) 313 of a display assembly 300 exits to the outside of the door 10. The first through hole 21 may be formed to have a minute size using a laser processing or an etching, and may be formed to have a size which may not be recognized or visibly perceived from the outside when the LEDs 313 do not emit light. Each of the minute holes may have a size of 0.2 mm-0.5 mm, and each segment may include 24-36 number of minute holes. As can be appreciated, the number of holes in a segment may vary based on the size of the segment desired.

Transparent sealing members 22 may be filled inside the first through holes 21. The sealing members 22 prevent the first through holes 21 from being blocked by foreign materials. The sealing members 22 may be formed of a silicone or an epoxy material to fill the first through holes 21, and may be formed of a transparent material so that light passes therethrough. In addition, since the inside of the first through holes 21 is filled with the sealing members 22, there is also an effect that a processed surface of the first through holes 21 is prevented from being corroded. In certain instances, the sealing members may also assist in appropriate diffusion of the light.

The sealing members 22 are filled inside the first through holes 21 through a separated process, e.g., a surface coating process of the front panel 20. Alternatively, a transparent sheet may be attached to the front surface the front panel 20, and thus the first through holes may be blocked from introduction of foreign materials. For example, an anti-fingerprint coating solution and/or a diffusive sheet provided at the front surface of the front panel 20 may serve as the sealing members 22.

The touch operation unit 12 is a portion or a region marked so that a user touches with fingers, and a touch sensor assembly 500 senses touch input on the touch operation unit 12 by a user. The touch operation unit 12 may be marked or formed at the front surface of the front panel 20 using a surface processing such as an etching, a printing, or other surface processing. In addition, the touch operation unit 12 may be formed in a non-protrusive shape when seen from the outside.

The door liner 30 is coupled to the front panel 20, and faces an inside of the storage space when the door 10 is closed. The door liner 30 may be injection molded from a plastic material, and a gasket may be disposed therealong or an installation structure for coupling of a basket or the like may be provided. In addition, when the door liner 30 and the front panel 20 are coupled, a space between the door liner 30 and the front panel 20 may be formed, and may be filled with a foam solution to form a heat insulating material 24.

A frame 100 may be attached to a rear surface of the front panel 20. The frame 100 is provided to form a separate space (interior space) inside the door 10 in which a foam solution is not filled. The separated or interior space formed by the frame 100 accommodates a display cover 200, the display assembly 300, the touch sensor assembly 500, a display frame 400, and the like.

The deco members 40 and 43 provide a trim to define an upper side and a lower side of the door 10, and cover openings formed between an upper end and a lower end of the front panel 20 and an upper end and an lower end of the door liner 30, respectively. A hinge hole through which a hinge, which is a pivot of the door 10 passes, may be formed at an edge of a side of the deco member 40. Wires introduced inside the frame 100 through the hinge hole may extend, power may be supplied to electric components inside the frame 100, and operation signals may be transmitted and received.

An insertion hole 41 is formed at a deco member 40 of the deco members 40 and 43 which is coupled to the upper end of the door 10, and the insertion hole 41 is covered by a insertion hole cover 42. The insertion hole 41 aligns with the separated or interior space defined by the front panel 20 and the frame 100. When the door 10 is assembled, the display assembly 300 coupled to the display frame 400 may be inserted into the frame 100 through the insertion hole 41. The insertion hole 41 may be formed to have a size to allow the display frame 400 to be inserted thereinto, and may be positioned right above the display cover 200.

A door handle 44 may be provided at the deco member 43 coupled at the lower end of the door 10. The door handle 44 may be formed by a part of the deco member 43 being recessed in a pocket shape, and a user may grip the recessed door handle 44 and pivot the door 10. A lever 45 may be further provided at the deco member 43 of the lower end of the door 10 to perform open/close operations of the door 10. Specifically, as a latch assembly 31 is driven by operating the lever 45, the door 10 may maintain an opened or a closed state.

The display cover 200 is adhered at the rear surface of the front panel 20. The display cover 200 is configured to guide installation of the display assembly 300 having at least one LED 313 (see FIG. 13) mounted thereon and may be adhered at the rear surface of the front panel 20 using an adhesive member 25, e.g., a double-sided tape or a primer.

The touch sensor assembly 500 senses a user's touch of the front panel 20 and may be mounted on a side of the display cover 200. The display cover 200 may be attached to the front panel 20 in a state in which the touch sensor assembly 500 is mounted on the display cover 200. When the display cover 200 is attached to the rear surface of the front panel 20, the display window 11 formed on the front panel 20 matches the second through holes 220 formed in the display cover 200. In addition, the display cover 200 is accommodated in the frame 100 in a state in which the display cover 200 is attached to the rear surface of the front panel 20.

When the display assembly 300 is mounted on the display frame 400, the display assembly 300 may be inserted into an inner space of the frame 100 through the insertion hole 41. A coupled body of the display frame 400 and the display assembly 300 is inserted into an insertion space defined by the display cover 200. When the display frame 400 is completely inserted into the inside of the frame 100, the display assembly 300 is positioned in the rear of the second through holes 220 of the display cover 200. Accordingly, light emitted from the LED 313 may pass the display cover 200 and the display window 11 and may be emitted toward an outside of the door 10.

Referring to FIGS. 5 to 8, a front side and an upper side of the frame 100 are opened. When the frame 100 is attached to the rear surface of the front panel 20, an opening 110 is formed at the upper side of the frame 100. A front end of the frame 100 is bent in a direction parallel to the front panel 20, and forms a frame adhesive portion or flange 120. Specifically, the frame adhesive portion 120 adheres to the rear surface of the front panel 20, and is bent to have a predetermined width in a direction toward an outside of the frame 100. Since an upper end portion of the frame 100 is opened, the frame adhesive portion 120 may be formed in a U shape which connects a left side of a front side portion, a lower side of the front side portion, and a right side of the front side portion of the frame 100.

The adhesive member 25 formed of a double-sided tape or an adhesive may be provided at the frame adhesive portion 120, and the frame 100 may be attached to the rear surface of the front panel 20. When the frame 100 is attached to the rear surface of the front panel 20, the upper side of the frame 100 contacts a bottom surface of the deco member 40. Because the deco member 40 is provided on the upper side of the frame 100, the opening 110 of the frame 100 communicates with the insertion hole 41 formed at the deco member 40.

Even though a foam solution configured to form the heat insulating material or foam 24 is introduced inside the door 10, the foam solution is not introduced into the inner space of the frame 100. A plurality of reinforcement ribs 130 may be formed at a rear surface of the frame 100 in a grid shape or pattern. Accordingly, even though a high pressure foam solution configured to form the heat insulating material 24 is foamed inside the door 10, a shape of the frame 100 may not be deformed or broken due to the reinforcement rib 130, and the inner space of the frame 100 may be stably maintained.

In addition, a support plate 141 may be seated on an upper region of the front side portion of the frame 100. To this end, plate support portions 140 (or plate support) may be formed at a left edge and a right edge of the front side of the frame. The plate support portions 140 may be formed by parts of inner edges of the frame adhesive portion 120 being stepped at a height corresponding to a thickness of the support plate 141.

When the display cover 200 is provided inside the frame 100, the support plate 141 is provided to cover the front side portion of the frame 100 corresponding to an upper side of the display cover 200. When the support plate 141 is seated on the plate support portions 140, a front surface of the support plate 141, a front surface of the display cover 200, and the frame adhesive portion 120 are formed on the same plane. When the frame 100 is attached to the rear surface of the front panel 20, a phenomenon in which the frame 100 is shaken or is not firmly attached to the front panel 20 because of a height difference between the support plate 141 and a front side portion of the display cover 200 may be prevented. In addition, a portion of the front panel 20 in which a height difference is generated is prevented from being deformed by an impact from the outside.

The plate support portions 140 are configured to support left and right ends of the support plate 141. When the frame 100 is attached to the front panel 20, the support plate 141 may slide and be inserted into a space formed between the plate support portion 140 and the rear surface of the front panel 20. In addition, the support plate 141 may also be attached to the rear surface of the front panel 20 with the frame 100 in a state in which the support plate 141 is fixed to the plate support portion 140.

A wire inlet hole 150 may be formed at an upper portion or region of a side of the frame 100. The wire inlet hole 150 forms a path to allow passage of wires connecting electric components provided inside the frame 100 and a power components of the cabinet. As the wire inlet hole 150 is formed at an upper portion of the side thereof adjacent to a hinge of the door 10, a distance between the wire inlet hole 150 and a hinge hole of the door 10 may be minimized. Before the wires are disposed through the wire inlet hole 150 and a foam solution is foamed inside the door 10, a finishing process which covers the wire inlet hole 150 is performed, and thus a foam solution is prevented from being introduced into the frame 100.

Restraint or restriction grooves 160 may be respectively formed at left and right sides of the frame 100. The restraint grooves 160 are portions into which restraint portions or rail guide 230 which protrude in a widthwise direction of the display cover 200 from both side ends of the display cover 200 are respectively inserted. As the restraint groove 160 is formed to be recessed in a shape corresponding to that of the restraint portion 230, the display cover 200 is not shaken in a state in which the display cover 200 is accommodated in the frame 100, and maintains a correct position.

Cover support portions 170 (or cover support) support the display cover 200 and may be formed to protrude at side surfaces corresponding to lower sides of the restraint grooves 160 of inner surfaces of the frame 100. The displace cover 200 is provided in the inner space of the frame 100 below the lower sides of the restraint grooves 160. The cover support portions 170 protrude from left and right side surfaces of the frame 100 toward a center of the frame 100, and push to support both side ends at a rear surface of the display cover 200.

When the frame 100 is attached to the front panel 20 and a foam solution is foamed inside the door 10, the display cover 200 is attached to the rear surface of the front panel 20, and the cover support portions 170 push forward the display cover 200 to maintain the display cover 200 attached to the front panel 20. The adhesive member 25 adheres the display cover 200 to the rear surface of the front panel 20, but when the adhesive member hardens and loses its adhesiveness, the display cover 200 is pressed against the rear surface of the front panel 20 by a force of the cover support portions 170 pressing against the display cover 200.

A plurality of cover support portions 170 may be vertically provided at predetermined intervals, and evenly push and support the entire rear surface of the display cover 200. In addition, one or a plurality of protrusive portions 171 (or bumps) may be further formed at front surfaces of the cover support portions 170 which contact the rear surface of the display cover 200. The protrusive portion 171 may be formed in a rib shape formed in a lengthwise direction or in a protrusive shape having a hemisphere shape, and may be in line or point contact with the display cover 200. Accordingly, even though contact surfaces between the display cover 200 and the cover support portions 170 are not even, the display cover 200 may not incline. In addition, the cover support portions 170 may transmit even pressure to the display cover 200.

For example, when the display cover 200 is obliquely inclined forward or backward and is pressed against the rear surface of the front panel 20, the frame 100 may be pressed by a foam solution. While the protrusive portions 171 which press the surfaces of the display cover 200 corresponding to a side comparatively far away from the front panel 20 are worn down by pressure of the foam solution, the display cover 200 may be aligned at a right position.

The display cover 200 may be formed of a plate-shaped plastic material, and may be provided in the frame 100 where the display cover 200 is attached to the front panel 20. An accommodation portion or opening 210 at which the touch sensor assembly 500 is installed is formed at the display cover 200. After assembly, the plurality of second through holes 220 may be formed at the display cover 200 of a position/location corresponding to the display window 11.

Figure 8:
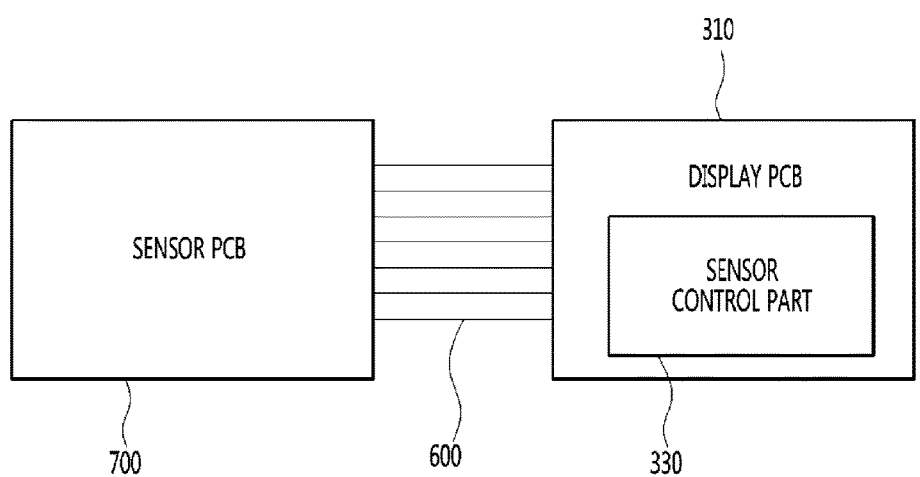
FIG. 8 is a block diagram for showing connection between a sensor printed circuit board (PCB) and a display PCB.

The display assembly 300 may include a display PCB 310 on which the LED 313 is mounted, and a reflector 320 disposed at a front surface of the display PCB 310. An LED controller configured to drive the LED 313, and a sensor controller 330 configured to drive the touch sensor assembly 500 may be mounted on the display PCB 310. The sensor controller 330 processes touch signals of the front panel 20 sensed through the touch sensor assembly 500 using the display PCB 310. As illustrated in FIG. 8, a sensor PCB 700 and the display PCB 310 which constitute the touch sensor assembly 500 may be connected using a cable connector 600.

The cable connector 600 may include a first cable connector 610 connected to the sensor PCB 700, and a second cable connector 620 connected to the display PCB 310. Terminals may be formed at end portions of the first cable connector 610 and the second cable connector 620 to electrically connect them.

While the display assembly 300 is installed at the door 10, the first cable connector 610 and the second cable connector 620 may extend to have a length to connect each other at the outside of the door 10. When the display cover 200 is attached to the rear surface of the front panel 20, the first cable connector 610 may be formed at least longer than a distance from an upper end of the touch sensor assembly 500 to the insertion hole 41. When the touch sensor assembly 500 is installed at the display cover 200, the cable connectors 610 and 620 are connected at an outside of the insertion hole 41, and the display assembly 300 is inserted and installed at an inside of the insertion hole 41.

Figure 5:
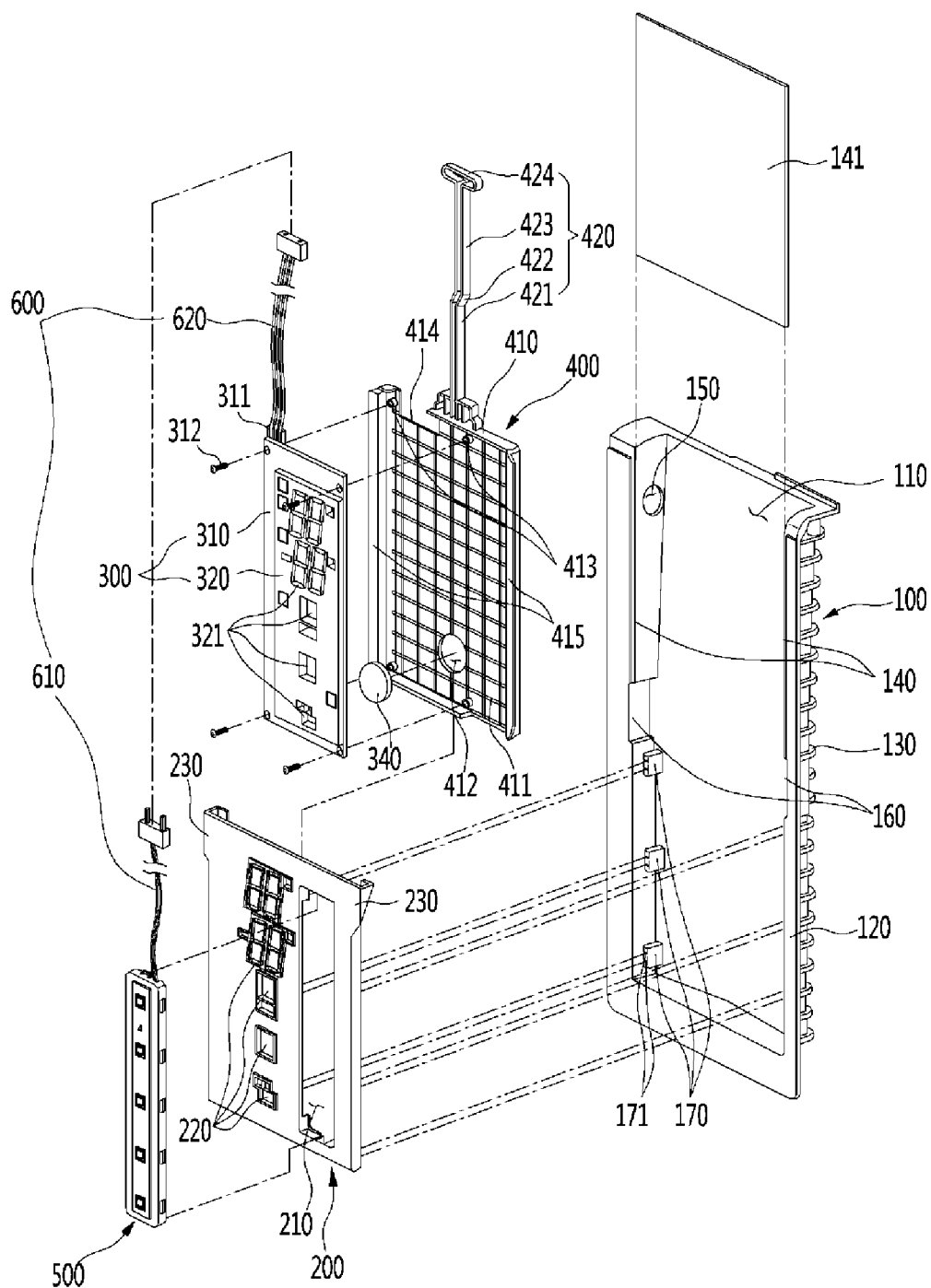
FIG. 5 is an exploded perspective view illustrating a coupling structure of a touch sensor assembly and a display cover, a display assembly, a display frame, and a frame according to an embodiment of the present disclosure.
Figure 6:
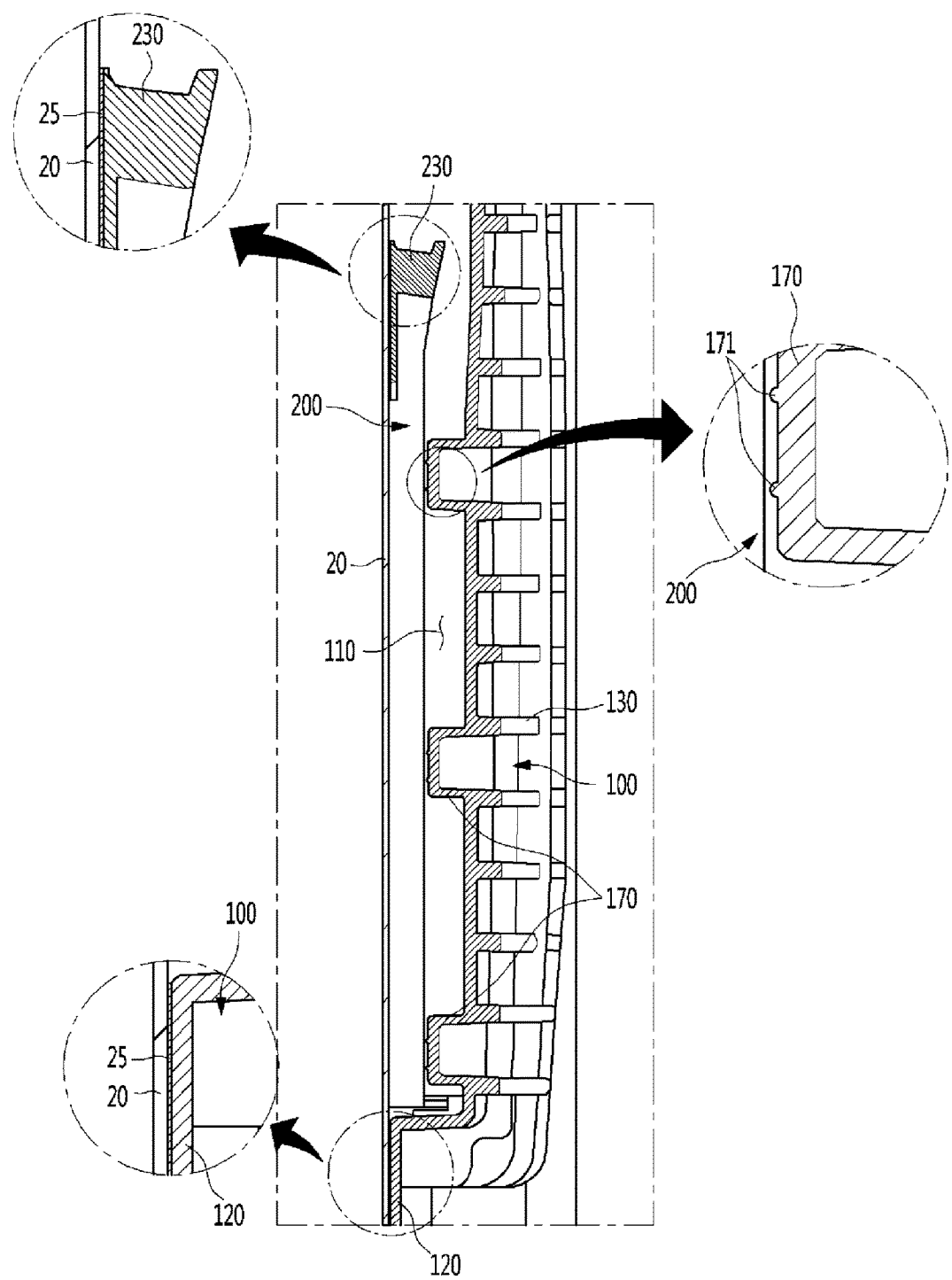
FIG. 6 is a longitudinal sectional view taken along line 6-6' of FIG. 3.
Figure 7:
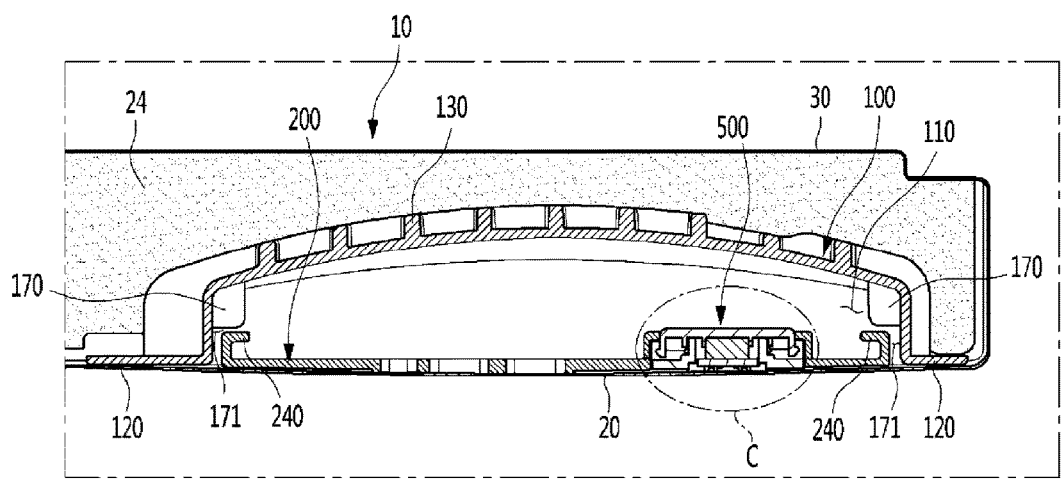
FIG. 7 is a transversal sectional view taken along line 7-7' of FIG. 3.

A display terminal 311 connected to the second cable connector 620 may be disposed at a left side of an upper end of the display PCB 310 (seen from FIG. 5). As the display terminal 311 is disposed at a position as far away from the touch sensor assembly 500 as possible to minimize a possibility of static electricity generated when a user's finger touches the front panel 20 is transmitted to the display PCB 310. The possibility in which the static electricity is transmitted to the display PCB 310, and components mounted on the display PCB 310 are electrically damaged is minimized.

The reflector 320 attached to the front surface of the display PCB 310 guides light emitted by the LED 313 to focus on the first through holes 21. The reflector 320 not only guides the light emitted by the LED 313 but also enables the display PCB 310 and the display terminal 311 to be spaced a distance corresponding to a thickness of the reflector 320 from the rear surface of the front panel 20, and protects the display PCB 310 from static electricity.

Because the front panel 20 is formed of a stainless steel and the display assembly 300 is provided to be adjacent to the display window 11, the front panel 20 may be vulnerable to static electricity generated when a user touches the touch operation unit 12. As the reflector 320 is provided at the front surface of the display PCB 310, the display PCB 310 is structurally spaced apart from the front panel 20. The reflector 320 simultaneously improves transmission of light and protects the display PCB 310 from static electricity.

The third through holes 321 are formed at the reflector, and location/position of the holes 321 corresponds to an arrangement of the LED 313 to allow communication with the second through holes 220 and the first through holes 21. When the display assembly 300 is mounted on the display frame 400, and the display frame 400 is mounted on the display cover 200, the first through holes 21, the second through holes 220, and the third through holes 321 are pressed forward or backward against each other and communicate with each other. Accordingly, light emitted by the LED 313 passes through the first to the third through holes 21, 220, and 321 and is emitted to the outside of the door 10 through the display window 11.

An audio output unit or component 340 may be provided at a rear surface of the display PCB 310. The audio output unit 340 may be configured to provide an audio output, e.g., sound, indicative of an operation state of the refrigerator 1, and may be an actuator, a speaker, a buzzer, and the like. The audio output unit 340 may be inserted into a frame hole 412 formed in the display frame 400. Accordingly, a sound output from the audio output unit 340 is transmitted to a user located in front of the door 10, and the user may recognize the operation state or a driving state of the refrigerator 1.

The display frame 400, in which the display assembly 300 including the display PCB 310 is installed, may have a plate shape so that the display PCB 310 can be seated. A space to accommodate the display PCB 310 is defined at a front side of the display frame 400 by an edge 410 which extends along an edge of the display frame 400 and protrudes forward from the display frame 400. In addition, a sliding insertion portion or rail 415 may be formed at a front end of the edge 410 at left and right edges of the display frame 400. The sliding insertion portion 415 is formed in a shape of rib bent in a direction perpendicular to the edge 410, i.e., in a widthwise direction of the display frame 400.

When the display frame 400 is coupled to the display cover 200, the sliding insertion portion 415 is inserted into an inside of a rail guide 240 formed at the display cover 200.

Accordingly, the display frame 400 may be smoothly inserted into the display cover 200 by the sliding insertion portion 415.

A reinforcement rib 411 vertically and horizontally extending at predetermined intervals to form a grid may be provided at the entire front side of the display frame 400. A frame cut portion or a frame cut out 414 may be formed at an upper end of the display frame 400. As the frame cut portion 414 is cut at a position corresponding to the display terminal 311, interference between the display terminal 311 and the display frame 400 may be prevented.

In addition, bosses 413 may protrude at the front side of the display frame 400, and screws 312 are fastened into the bosses 414 to fix the display PCB 310 to the display frame 400. Due to the protrusion of the bosses 413, the display PCB 310 is spaced a prescribed distance corresponding to a protrusion height of the bosses 413 from the front side of the display frame 400.

A frame handle 420 may extend upward at a central location of the upper end of the display frame 400. The frame handle 420 allows a user to manipulate the display frame 400 for insertion into the display cover 200. The frame handle 420 includes a first vertical portion or rod/shaft 421 which extends from the display frame 400, a inclined portion or rod/shaft 422 which inclines backward from an upper end of the first vertical portion 421, and a second vertical portion or rod/shaft 423 which extends upward from an upper end the inclined portion 422.

The first vertical portion 421 and the second vertical portion 423 extend in parallel each other, and connected by the inclined portion 422. A grip portion or grip handle 424 extends in a horizontal direction at an upper end of the second vertical portion 423.

Accordingly, the user may grip the grip portion 424 to insert the display frame 400 from the lower end of the display frame 400 into an inside of the insertion hole 41 and into the display cover 200. Due to the structure of the frame handle 420, the display frame 400 may be increasingly pressed against the rear surface of the display cover 200 as the display frame 400 is increasingly inserted downward.

When the display frame 400 is completely inserted into an inside of the display cover 200, and the insertion hole cover 42 is installed at the insertion hole 41, a bottom surface of the insertion hole cover 42 may contact a top surface of the grip portion 424. In order to allow coupling between the grip portion 424 and the cover 42, a bottom surface of the insertion hole cover 42 may be contoured to have a negative relief of grip portion 424. When the insertion hole cover 42 is provided over the insertion hole 41, an upper end of the frame handle 420 may be coupled via the negative relief at the bottom surface of the cover 42 to maintain a fixed state.

Figure 9:
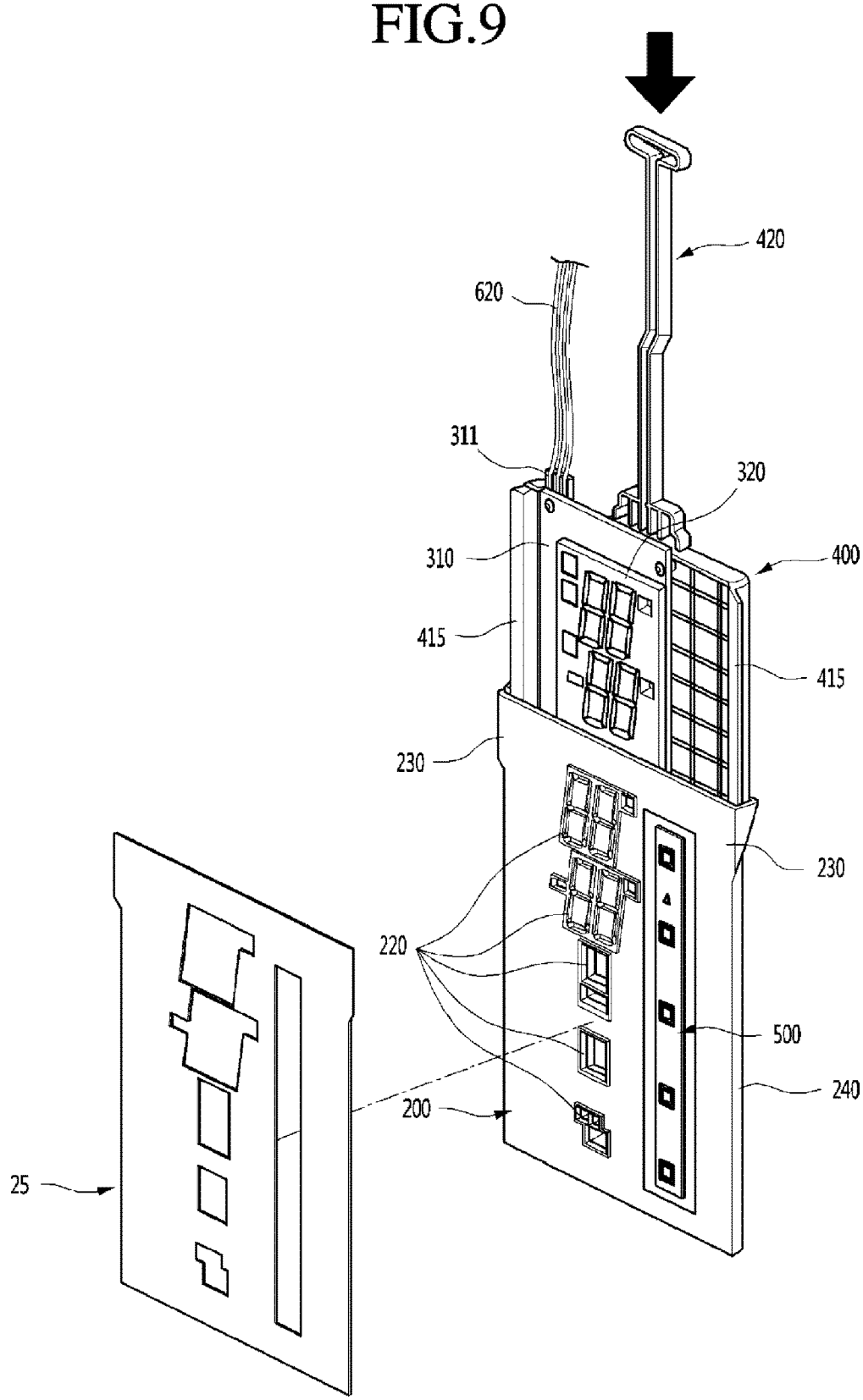
FIG. 9 is a perspective view illustrating a coupling structure of the display cover and the display frame.
Figure 10:
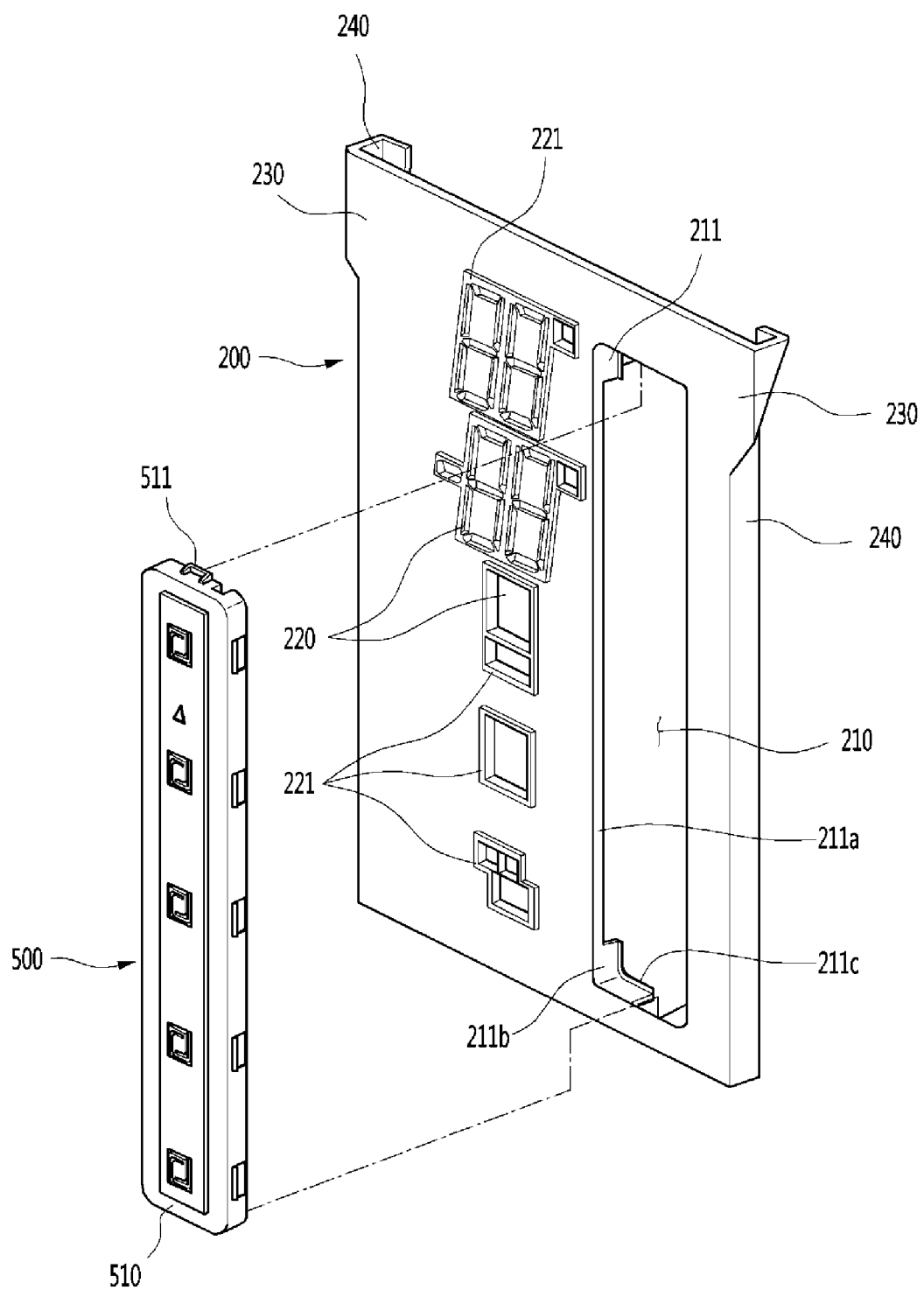
FIG. 10 is an exploded perspective view illustrating a coupling structure of the display cover and the touch sensor assembly.
Figure 11:
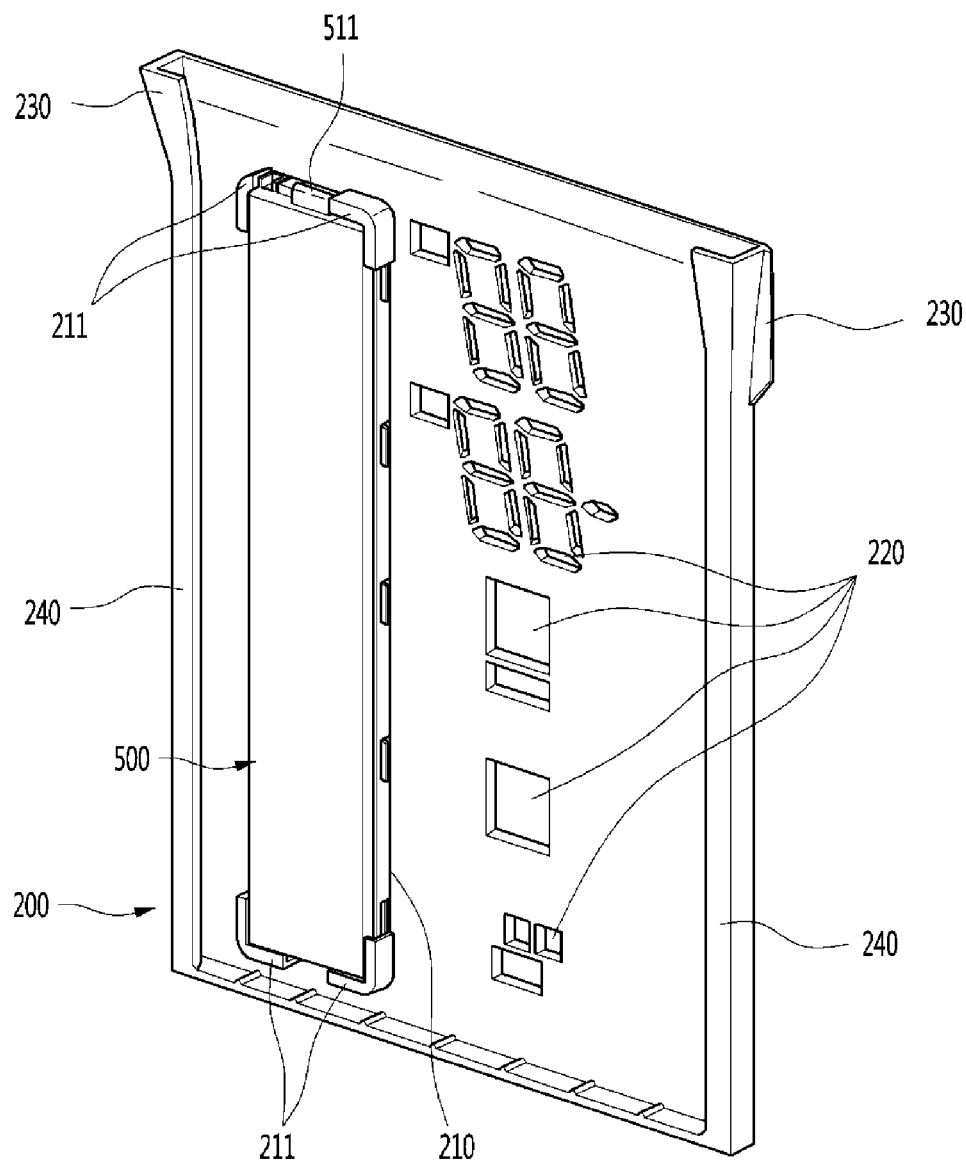
FIG. 11 is a perspective view illustrating the display cover in which the touch sensor assembly is installed, seen from behind.

Referring to FIGS. 9 to 11, the rail guide 240 is formed at left and right sides of the display cover 200. If the display cover 200 is made from a bendable material, e.g., metallic, the rail guide 240 may be formed at both ends of the display cover 200 by bending the ends a plurality of times, and the sliding insertion portion 415 is inserted into the inside of the display cover 200 along the guide rail 240.

As illustrated in FIG. 11, a forward and backward width (groove thickness) at an upper end of the rail guide 240 is greater than a forward and backward width at a lower end portion to facilitate insertion of the sliding insertion portion 415. In addition, a rear side of the rail guide 240 is inclined in a direction toward the front surface of the display cover 200 such that the groove width decreases toward a lower portion of the rail guide 240.

As the display frame 400 is increasingly inserted into the display cover 200, the display assembly 300 at a front surface of the display frame 400 is increasingly pressed against the display cover 200. When the display frame 400 is completely inserted into the display cover 200, the sliding insertion portion 415 is fixed to an inside of the rail guide 240, and the reflector 320 is completely pressed against the rear surface of the display cover 200. Further, the third through holes 321 are aligned forward and backward with the second through holes 220.

The front surface of the display cover 200 is attached or fixed to the rear surface of the front panel 20, and the accommodation portion 210 is formed at a side of the front surface of the display cover 200 to accommodate the touch sensor assembly 500. The accommodation portion 210 may be an opening having a shape corresponding to a shape of the touch sensor assembly 500, and the touch sensor assembly 500 is inserted therein. When the touch sensor assembly 500 is mounted in the accommodation portion 210, a front surface of the touch sensor assembly 500 and the front surface of the display cover 200 are on the same plane, i.e., the front surfaces are flush with each other.

Housing support portions or housing supports 211a and 211b may be formed to extend backward or rearward from the display cover 200 to define the opening of the accommodation portion 210. At the four corners of the opening, the housing support portions 211b extend in a "L" shape from the four corners of the accommodation portion 210. The housing support portions 211a support the side of the touch sensor assembly, and housing support portions 211b support the side corners of the touch sensor assembly 500. In addition, an end 211c of the housing support portion 211 may be bent to press against a rear surface of the touch sensor assembly 500. The sides, corners and the rear surfaces of the touch sensor assembly 500 are supported by the housing support portion 211a, 211b and 211c (hereinafter collectively referred to as "211"). Even when a user touches the front panel 20, and the front surface of the touch sensor assembly 500 is pressed, the touch sensor assembly 500 is not moved backward, and an initially assembled state is maintained.

Housing coupling portions or couplers 511 formed at an upper and a lower ends of a sensor housing 500a (see FIG. 14) clip into upper and lower edges of the accommodation portion 210, and at least one of the housing coupling portions 511 formed at the upper and the lower ends of the sensor housing 500a has a hook shape. When the touch sensor assembly 500 is inserted into the inside of the accommodation portion 210 from a front of the display cover 200, the housing coupling portions 511 clip onto an edge of the accommodation portion 210 such that the touch sensor assembly 500 is fixed and coupled to the display cover 200.

When the display cover 200 is attached to the rear surface of the front panel, the second through holes 220 formed at the front surface of the display cover 200 are aligned forward and backward with the first through holes 21. The second through holes 220 may also be opened in a shape corresponding to the seven segments (or eighty eight segments), and may also be formed in a shape of a plurality of simple holes to show other information.

Block portions or trims 221 may be formed at edges of the second through holes 220. The block portions 221 may protrude from the edges of the second through holes 220 toward a front of the display cover 200. The adhesive member 25 is provided at the front surface of the display cover 200, and may be coated or attached to only an external region of the block portions 221. When the display cover 200 is attached to the rear surface of the front panel 20, a gap size between the first through hole 21 and the second through hole 220 may be minimized by the thickness of the adhesive member 25 such that the leakage of light through the gap may be minimized. The block portions 221 may have a height, which effectively prevents light leakage. Based on the adhesive member 25 on the front surface of display cover 200 is compressed by pressure of the foam solution solidifying inside the door 10, the block portions 221 may protrude at a height less than a height before the adhesive member 25 is compressed.

Figure 12:
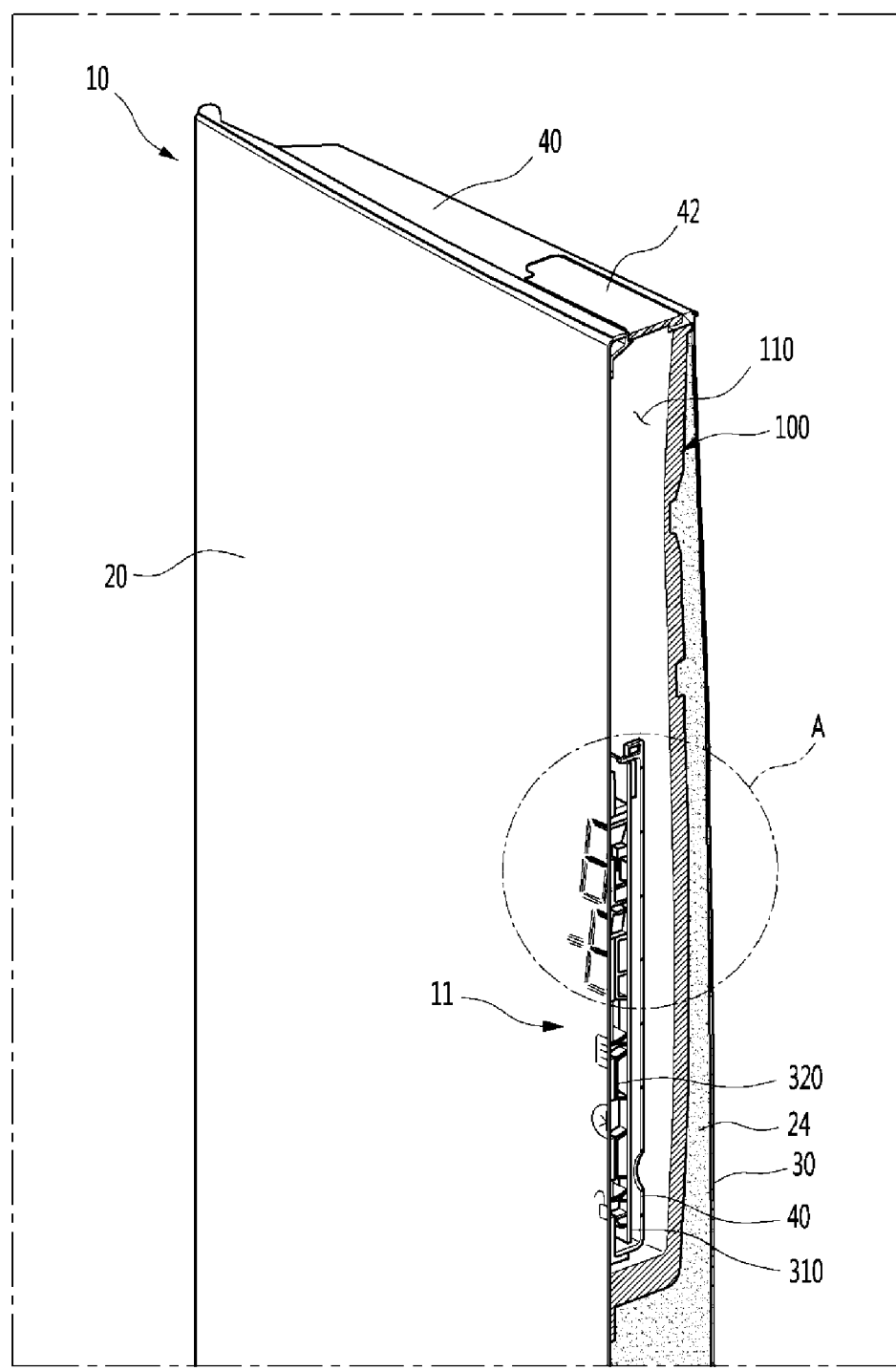
FIG. 12 is a cut away perspective view taken along line 12-12' of FIG. 2.
Figure 13:
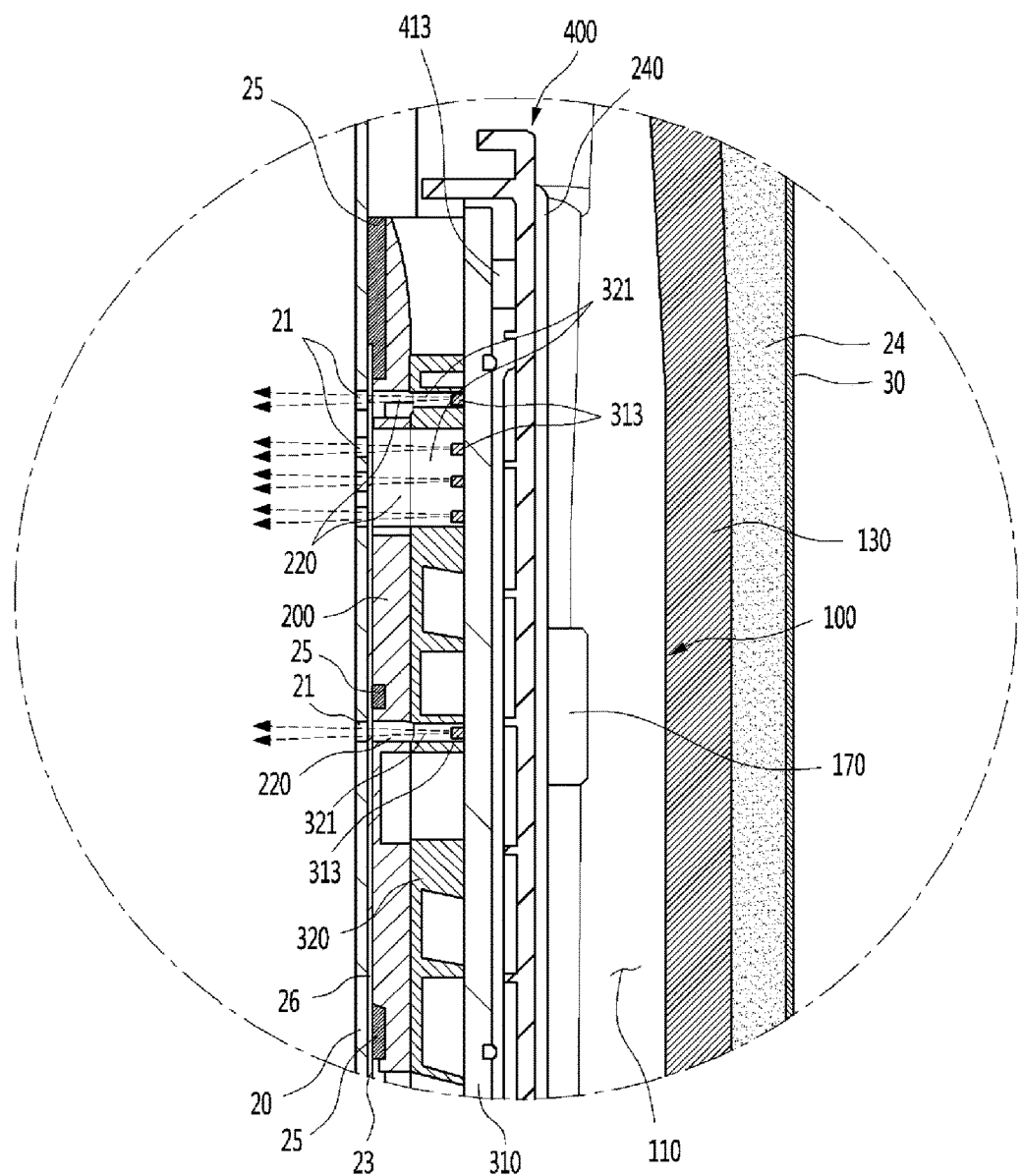
FIG. 13 is an enlarged cross-sectional view illustrating an A portion of FIG. 12.

Referring to FIGS. 12 and 13, the first through hole 21 and the second through hole 220 are communicated with each other when the display cover 200 is attached to the rear surface of the front panel 20 by the adhesive member 25. Because a size of each of the first through holes 21 may be substantially less than that of the second through hole 220, a plurality of the first through holes 21 may be provided in an inner region of a single second through hole 220.

When the display frame 400 is completely inserted into the display cover 200 and the display assembly 300 is positioned at the inside of the display cover 200, the third through holes 321 are aligned forward and backward with the second through holes 220. Sizes and shapes of the second through hole 220 and the third through hole 321 are the same, and as the reflector 320 is pressed against the rear surface of the display cover 200, the third through holes 321 may be accurately aligned directly behind the second through holes 220. As the first to the third through holes 21, 220 and 321 communicate with each other from front to back, light emitted by the LED 313 may sequentially pass the third through holes 321, the second through holes 220, and the first through holes 21, and may be emitted to the outside of the door 10.

A diffusive or diffusion sheet 26 may be attached at the rear surface of the front panel 20 corresponding to a region or an area in which the first through holes 21 are formed. The diffusive sheet 26 may diffuse light emitted by the LED 313, and the light emitted through the display window 11 may evenly light the entire display window 11. In addition, when the diffusive sheet 26 is attached to the rear surface of the front panel 20 corresponding to a region of the display window 11, the diffusive sheet 26 also additionally performs a function to cover all of the first through holes 21 such that an additional coating on the front surface of the front panel 20 may not be necessary, as described above.

Figure 14:
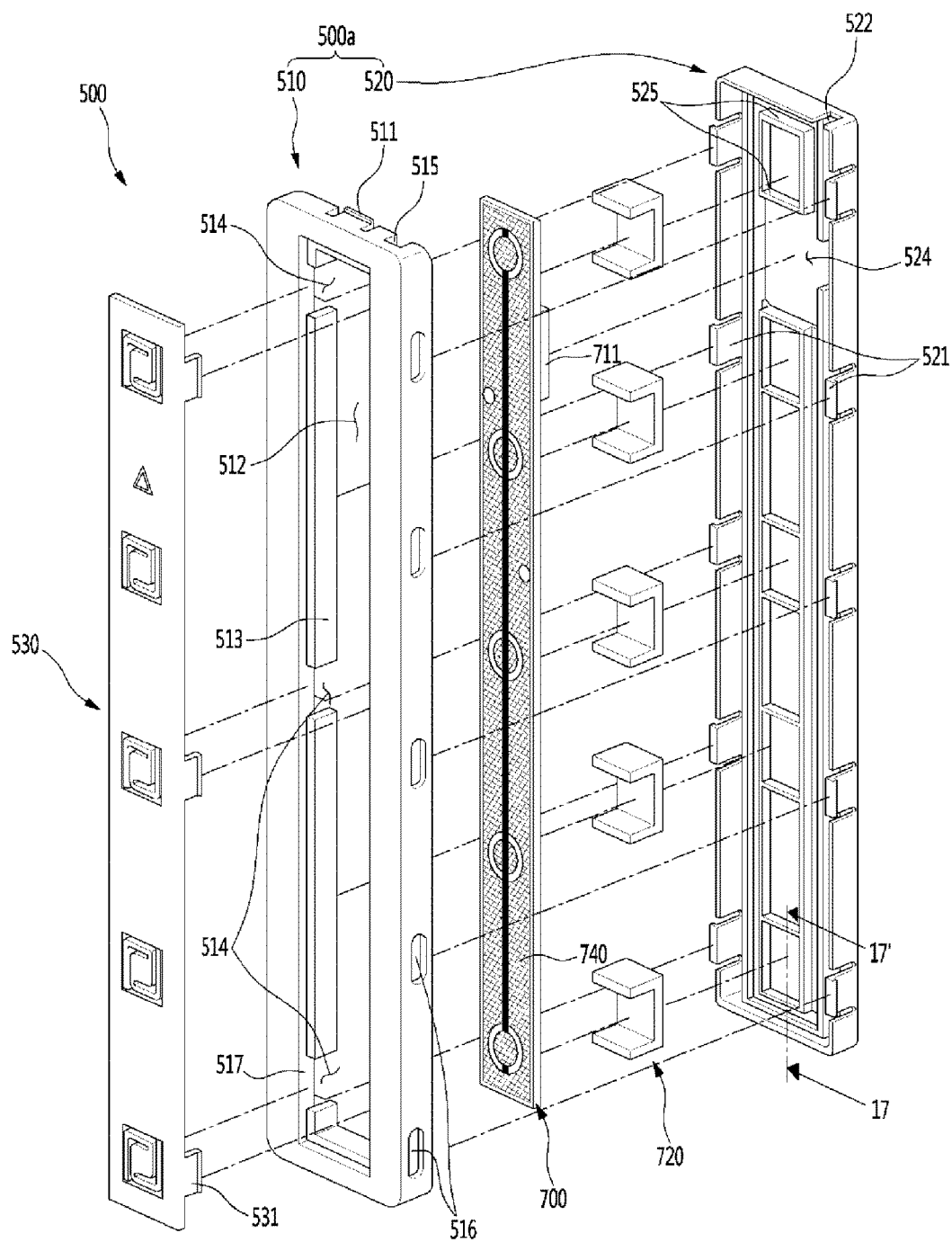
FIG. 14 is an exploded perspective view illustrating a touch sensor assembly according to an embodiment of the present disclosure seen from the front.
Figure 15:
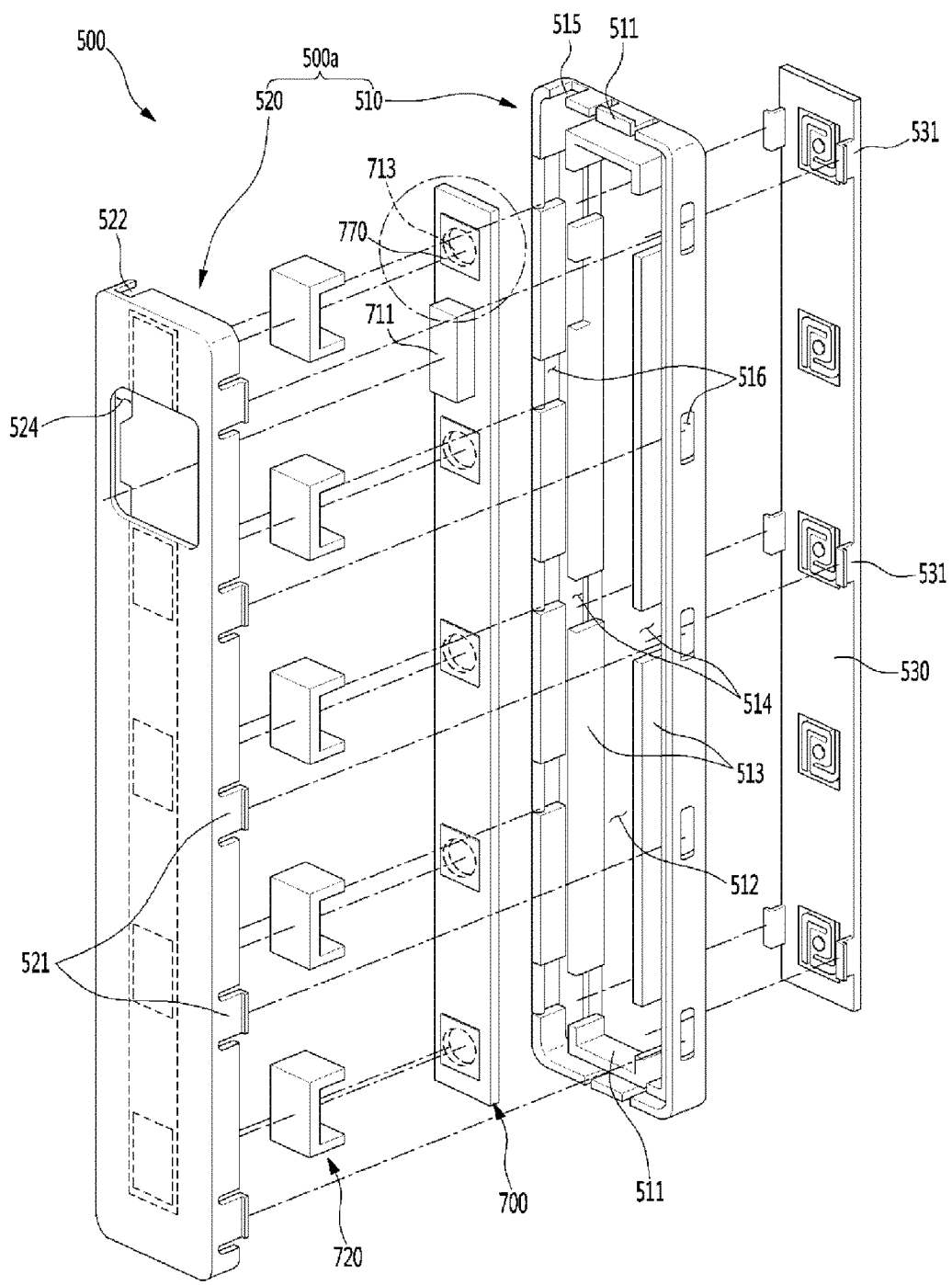
FIG. 15 is an exploded perspective view illustrating the touch sensor assembly seen from behind.

Referring to FIGS. 14 and 15, the touch sensor assembly 500 may include the sensor housing 500a forming the exterior of the touch sensor assembly 500, the sensor PCB 700 accommodated in an inside of the sensor housing 500a, an elastic member or support 720 to support the sensor PCB 700, and a touch booster or touch transfer plate 530 coupled to an opening 512 formed at a front side of the sensor housing 500a.

The sensor housing 500a includes a housing cover 510 and a housing body 520, and a space to house the sensor PCB 700 formed by the housing cover 510 and the housing body 520 being coupled to each other. The housing cover 510 may define a front and side surfaces of the touch sensor assembly 500, and the housing body 520 may define the rear surface of the touch sensor assembly 500. In addition, side surfaces of the housing body 520 and side surfaces of the housing cover 510 are overlapped.

The housing cover 510 forms the front surface, left and right surfaces, and top and bottom surfaces of the sensor housing 500a, and the housing coupling portion 511 are formed at the top and bottom surfaces of the housing cover 510. The housing coupling portion 511, as described above, enables the touch sensor assembly 500 to be fixed and mounted in the accommodation portion of the display cover 200. When the touch sensor assembly 500 is mounted in the accommodation portion 210, a front surface of the housing cover 510 may be exposed to an outside of the display cover 200 and attached to the rear surface of the front panel 20 by the adhesive member 25.

The opening 512 is formed at the front surface of the housing cover 510, and the touch booster 530 is mounted on the opening 512. The touch booster 530 is configured to allow transmission a spatial displacement (the amount of displacement) of the front panel 20 which is generated when a user touches and pushes the front panel 20 for detection of the user's touch input by sensors 750, which will be described hereinafter.

The opening 512 is formed to have a size and a shape corresponding to those of the touch booster 530, and the opening 512 is covered by the touch booster 530. An extending rib 517 is formed to extend backward from the housing cover 510 at an edge of the opening 512, and is pressed against a side surface of the touch booster 530. As the side surface of the touch booster 530 is pressed against an inner circumferential surface of the extending rib 517 and the touch booster 530 moves forward or backward due to touch pressure, inclination or shaking/rattling in a left and right direction is prevented.

In addition, booster support portions or booster support plates 513 may be respectively formed at left and right inner circumferential surfaces of the opening 512. Specifically, the booster support portions 513 protrude from the extending rib 517 toward a center of the opening 512, and extend along the inner circumferential surfaces of the extending rib 517.

The booster support portions 513 may extend from a position spaced a predetermined distance behind a front end portion of the extending rib 517 toward a rear of the housing cover 510 to a predetermined width. A distance between a front end portion of the extending rib 517 and a front end portion of the booster support portion 513 may be actually slightly less than a thickness of the touch booster 530. The thickness difference may correspond to the thickness of the adhesive member 25 attached to the display cover 200 such that the touch booster 530 contacts the rear surface of the front panel 20. In other words, a ledge is formed by the extending ribs 517 and the booster support portions 513, and the thickness of the ledge in the forward and rearward direction is less than the thickness of the touch booster 530. The booster support portion 513 supports left and right edges of a rear surface of the touch booster 530 when the touch booster 530 is installed thereat. Even though touch pressure is applied to a front surface of the touch booster 530 to cause spatial displacement, the touch booster 530 is prevented from moving backward past a predetermined position.

Hook grooves 514 are formed at the booster support portion 513, and the hook grooves 514 accommodate hooks or clips 531 formed at the touch booster 530. A space between two adjacent booster support portions 513 define each hook groove 514, and when the touch booster 530 is mounted on the opening 512, the hooks 531 formed at the touch booster 530 pass through the hook grooves 514.

When the touch booster 530 is mounted on the housing cover 510, end portions of the hook 531 are hooked on end portions of the extending rib 517. In this state, when the touch booster 530 moves backward by a touch pressure, the end portions of the hook 531 are separated from a rear end of the extending rib 517, and are pressed forward thereagainst again by the elastic member 720 upon release of the touch pressure, described hereinafter. A forward and backward movement distance of the touch booster 530 may be very small. When the touch booster 530 moves forward or backward, the hook grooves 514 prevent the touch booster 530 from being vertically shifted. The touch booster 530 may move a minute distance forward or backward by touch pressure.

As described above, the front surface of the touch booster 530 may protrude forward slightly more than the housing cover 510. When the touch sensor assembly 500 and the display cover 200 are attached to the rear surface of the front panel 20, the touch booster 530 is firmly pressed against the rear surface of the front panel 20 (See a cross-sectional view of FIG. 26). Accordingly, minute touch pressure applied to the front surface of the front panel 20 may be transmitted to the touch booster 530.

Cover coupling portions or grooves 516 may be formed at a side surface of the housing cover 510. The cover coupling portions 516 are grooves in which body coupling portions or clips 521 formed at the housing body 520 are inserted. The grooves have a hole shape so that the body coupling portions 521 having a hook shape are hanged or clipped thereinto to allow coupling between the housing body 520 and the housing cover 510.

Figure 18:
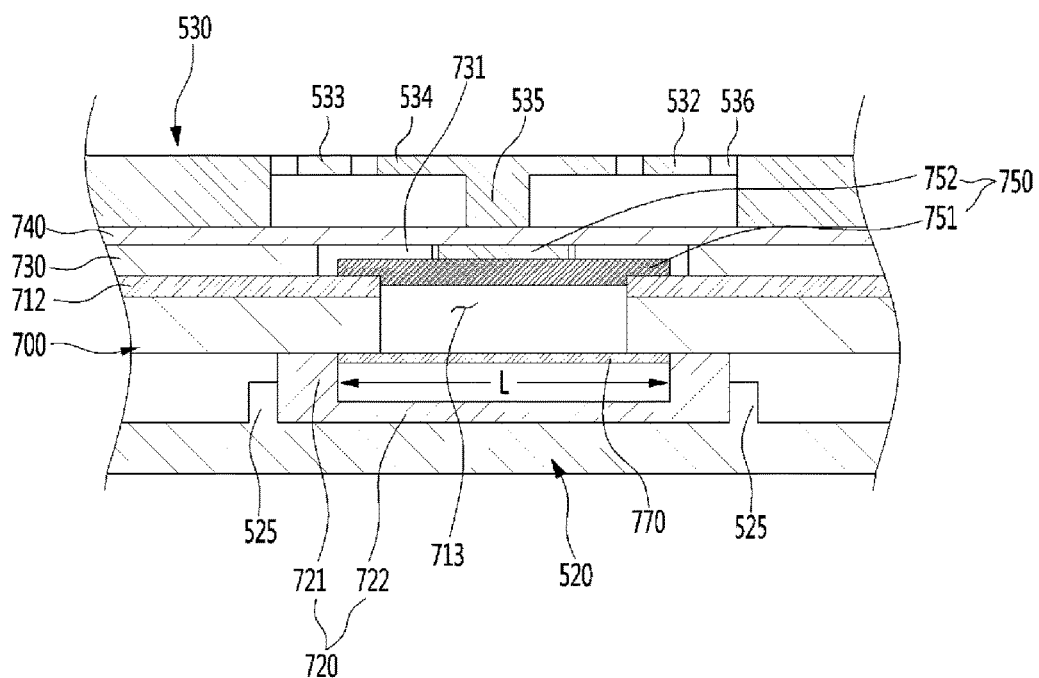
FIG. 18 is a longitudinal sectional view illustrating the touch sensor assembly.
Figure 19:
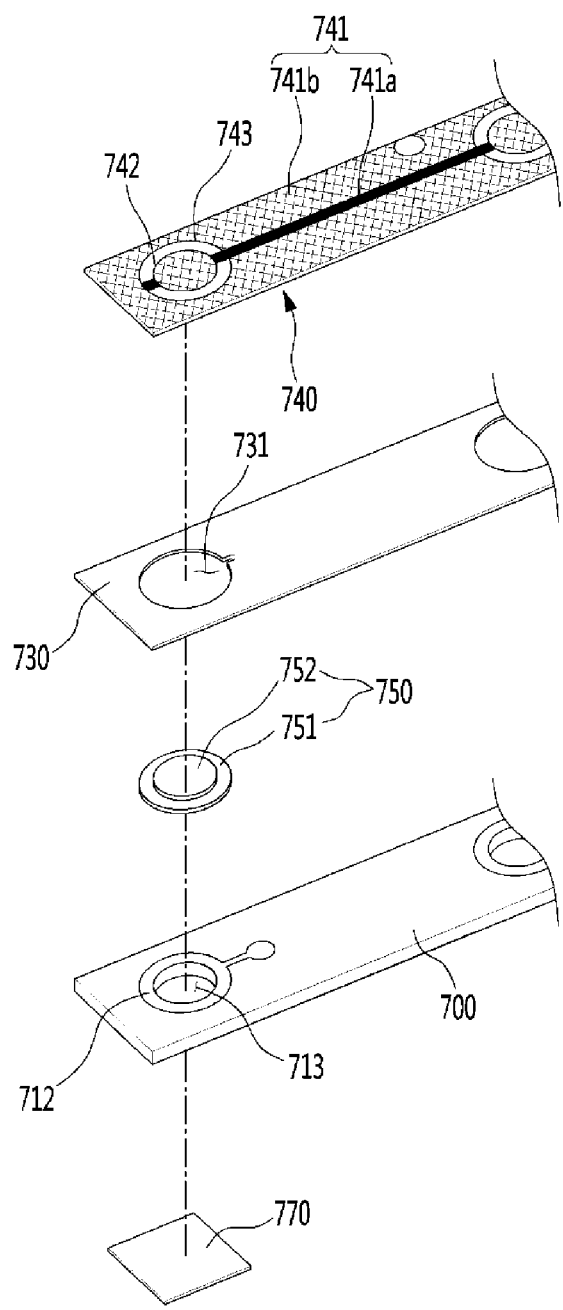
FIG. 19 is an exploded perspective view illustrating a coupling structure of a touch sensor which constitutes the touch sensor assembly.
Figure 20:
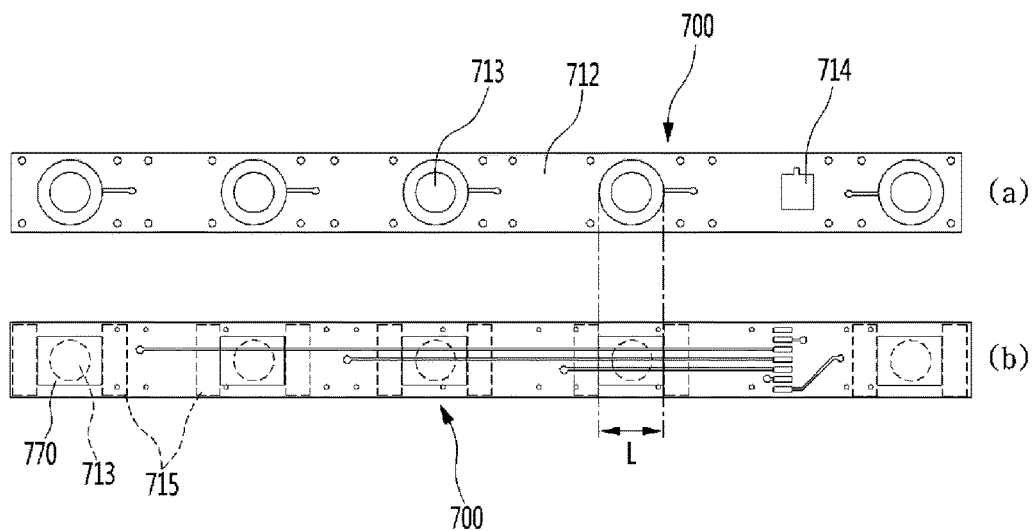
FIG. 20 illustrates a plan view (a) and a rear view (b) illustrating a sensor PCB which constitutes the touch sensor assembly.
Figure 21:
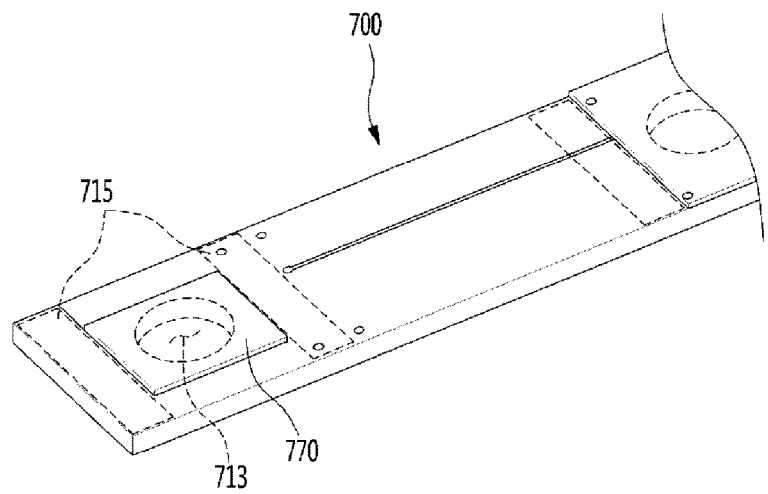
FIG. 21 is a partial perspective view when a cover member is mounted on the sensor PCB.

Further, the cover coupling portions 516 be formed at positions to allow uniform compression of a plurality of elastic members 720 provided at the sensor PCB 700 such that the sensor PCB 700 and the touch booster 530 are uniformly pushed forward. The positions of the cover coupling portions 516 and the body coupling portions 521 may be positioned between upper and lower ends of the sensor 750 (see FIG. 18). Because the touch booster 530 is firmly pressed against the front panel 20 based on the touch booster 530 protruding slightly forward from the front surface of the housing cover 510, the touch booster 530 may effectively sense touch pressure when a user touches the front surface of the front panel 20. A structure and a function of the sensor PCB 700 and the elastic member 720 will be described in detail hereinafter.

A wire hole 515 may be formed at a top surface of the housing cover 510. The wire hole 515 is opened so that the first cable connector 610 connected to a sensor terminal 711 installed at the sensor PCB 700 to pass through. The wire hole 515 may be formed at least one side of the housing cover 510 and the housing body 520. Further, a wire hole 522 may be formed at an upper side of the housing body 520. The wire hole 522 may be formed at the same position of the wire hole 515 of the housing cover 510, and may be formed so that the first cable connector 610 passes through. As can be appreciated, both wire holes 515 and 522 may not be required as long as at least one hole is provided in either the housing cover 510 or housing body 520.

The housing body 520 coupled to the housing cover 510 forms an exterior of the touch sensor assembly 500, and forms a space in which the sensor PCB 700 is installed. The housing body 520 may be formed with a rear surface and sides, which extend forward from four edges of the rear surface. The plurality of body coupling portions 521 may be formed at side surfaces of the housing body 520. The body coupling portions 521 may be formed by a part of a side portion of the housing body 520 being cut. Alternatively, the touch booster 530, housing cover 510 and the housing body 520 may be injection molded.

The plurality of cover coupling portions 516 and the body coupling portions 521 may be disposed at equal intervals in a lengthwise direction of the touch sensor assembly 500. In addition, left cover coupling portions 516 and right cover coupling portions 516 are formed at the same heights, which is also similar to the plurality of body coupling portions 521. Accordingly, when the housing cover 510 is coupled to the housing body 520 the elastic members 720 may be prevented from being inclined in one direction while the touch sensor assembly 500 is assembled since the same or substantially the same force is applied to the elastic members 720.

A terminal hole or opening 524 may be formed at a rear surface of the housing body 520 and a location of the terminal hole corresponds to a position of the sensor terminal 711 provided at the sensor PCB 70. The terminal hole 524 is formed to have a size corresponding to the sensor terminal 711, i.e., equal to or slightly greater than that of the sensor terminal 711, so that the sensor terminal 711 is exposed behind the housing body 520 through the terminal hole 524. When the sensor PCB 700 is shaken forward or backward, the sensor terminal 711 does not interfered with the rear surface of the housing body 520. Further, the first cable connector 610 is coupled to a side surface of the sensor terminal 711, and when a horizontal width of the terminal hole 524 is slightly greater than a horizontal width of the sensor terminal 711, a coupling state of the first cable connector 610 and the sensor terminal 711 may be confirmed through the terminal hole 524.

The sensor PCB 700 may include a spacer 730, the sensor 750, and a conductive foil 740, and may be supported by the elastic member 720 inside the sensor housing 500a. In addition, the touch booster 530 is mounted on the opening 512 directly behind the front panel 20 to move forward or backward. A contact between the touch booster 530 and the front panel 20 may be continuously maintained such that a forward and backward movement displacement of the front panel 20 generated when a user touches the touch operation unit 12 of the front panel 20 may be immediately transmitted to the sensor 750.

Reference numerals 713 and 770 are a sensor support portion and a cover member, respectively, and described hereinafter.

Figure 16:
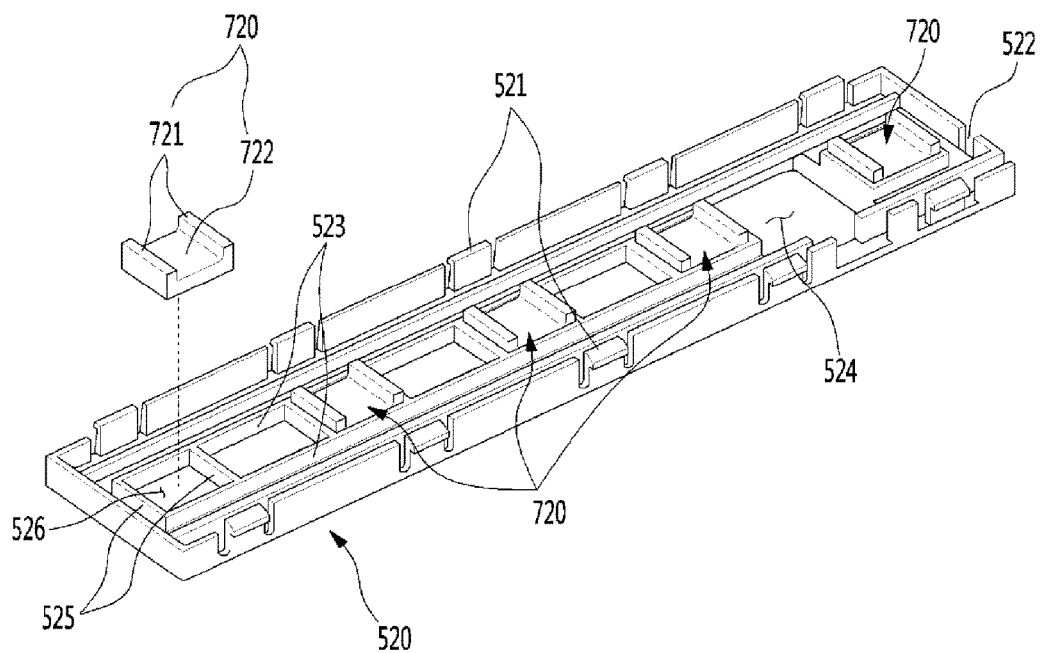
FIG. 16 is a perspective view when an elastic member is mounted on a housing body which constitutes the touch sensor assembly.
Figure 17:
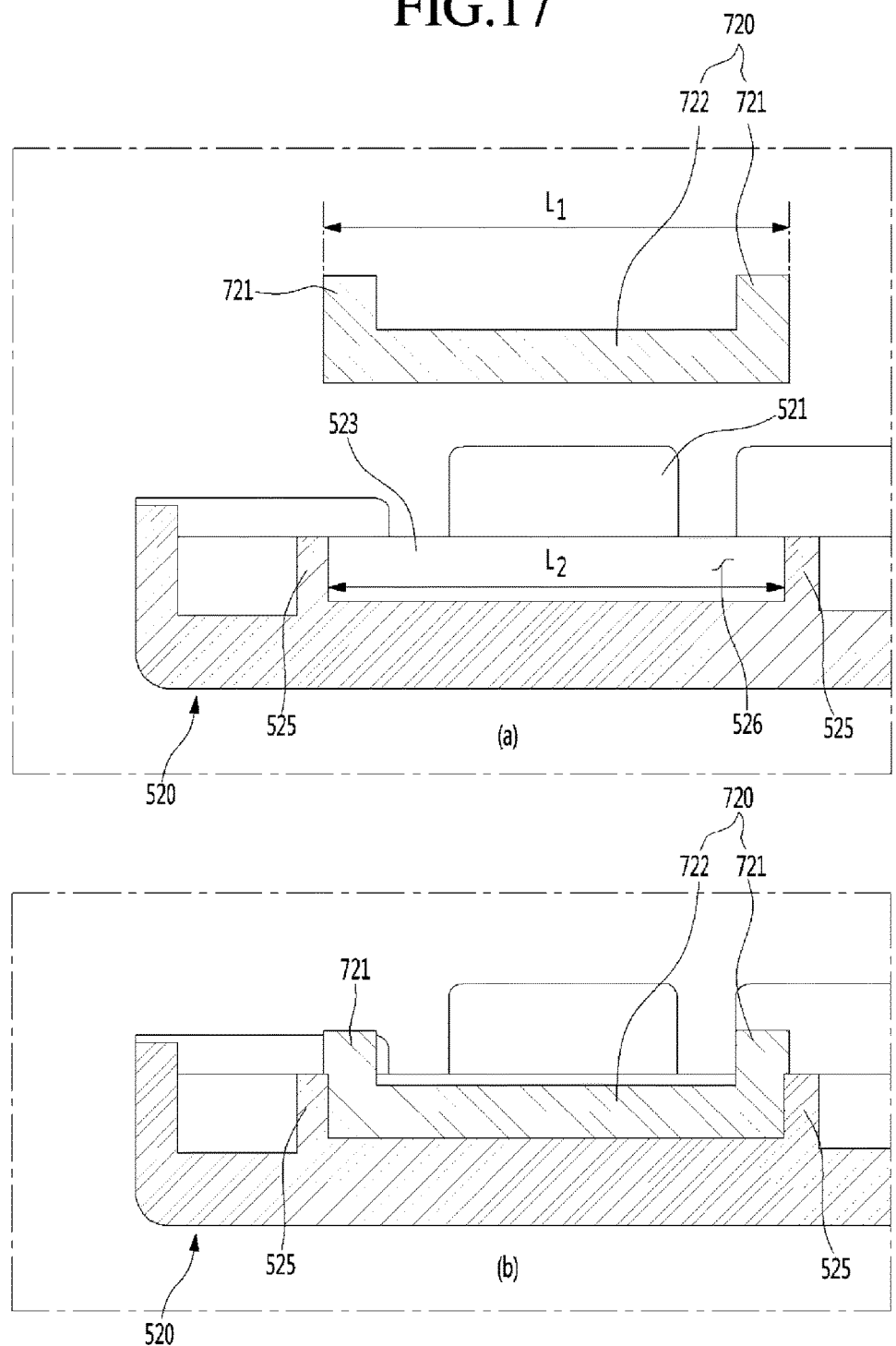
FIG. 17 is a cross-sectional view illustrating a process of mounting the elastic member on the housing body.

FIG. 16 is a perspective view when an elastic member is mounted on a housing body which constitutes the touch sensor assembly, and FIG. 17 is cross-sectional view illustrating a process of mounting the elastic member on a housing body, and is the cross-section view taken along line 17-17' of FIG. 14. The elastic member 720 may be fixed/mounted on the housing body 520. The elastic member 720 may be formed of a silicone having elasticity, or a synthetic rubber and a resin material having elasticity similar thereto. The elastic member 720 may be formed of a silicone material having hardness of about 15 to 25 (shore A). For example, a silicone material having hardness of about 20 (shore A) may be used.

When the hardness of the elastic member 720 is too high, a touch operation of the touch sensor 750 may not perform smoothly, and a user may be required to push the touch operation unit 12 with excessive force for the touch sensor 750 to recognize a touch pressure. However, when the hardness of the elastic member 720 is too low, the sensor PCB 700 is not be sufficiently pressed against the front panel 20. Accordingly, an appropriate material for the elastic member 720 is needed such that the material has a sufficient hardness for excellent sensitivity of a touch operation and simultaneously presses the sensor PCB 700 against the front panel 20. For preventing confusion and mix of components having a different hardness during the manufacturing process, the elastic member 720 may be dyed to have a specific color, e.g., blue.

The elastic member 720 may include a pair of support portions 721 (or a pair of support legs) perpendicular to the sensor PCB 700 toward a rear surface (or a bottom surface) of the sensor PCB 700, and an extension portion 722 (or extension) which connects the pair of support portions 721. As the elastic member 720 is formed in an "n" shape, first ends of the pair of support portions 721 may be pressed against a rear surface of the sensor PCB 700 and second ends may be connected by the extension portion 722.

The pair of support portions 721 are formed to be pressed against the rear surface of the sensor PCB 700 at the outside of an outer edge of the touch sensor 750, and are formed to support the sensor PCB 700. When the support portion 721 is in contact with the sensor PCB 700, the support portion 721 does not effect an operation or deformation of the touch sensor 750. For correct positioning and contact, the first ends of the pair of support portions 721 contact the sensor PCB 700 at installation markings 715 marked on the rear surface of the sensor PCB 700. If needed, the first ends of the support portions 721 may also be adhered to the installation mark portions 715 by an adhesive member. The support portion 721 may be formed to have a length for pressing the sensor PCB 700 toward the touch booster 530, that is, the front panel 20, while compressing the support portion 721 when the housing body 520 and the housing cover 510 are coupled.

The extension portion 722 connects the second ends of the pair of support portions 721. In addition, the extension portion 722 is in contact with a bottom surface of the housing body 520. In addition, since the pair of sensor support portions 721 are provided at positions facing each other based on the touch sensor 750 by the extension portion 722, a pressure may be uniformly transferred to the sensor PCB 700. When a pressure is applied on the touch sensor 750, the touch sensor 750 may not be inclined in a side direction, and may be maintained in a parallel state with the front panel 20.

Installation guides 523 and fixing ribs 525 may be formed on a rear side portion (or a bottom surface) of the housing body 520. Here, a surface on which the installation guide 523 and the fixing rib 525 are formed may be defined as the rear side portion when the housing body 520 is oriented vertically, and may be defined as the bottom surface when the housing body 520 oriented horizontally. Hereinafter, the term "rear" may be applied to either orientation.

The installation guide 523 and the fixing rib 525 guide mounting/fixing of a plurality of elastic members 720 by forming a space, e.g., an elastic member accommodation portion 526 in the figures, to accommodate the elastic member 720 attached onto the sensor PCB 700. Further, the hardness of the elastic member 720 may be reinforced by the installation guide 523 and the fixing rib 525, and further prevents twisting or deformation of the elastic members 720.

Specifically, the installation guides 523 may protrude from each of a left edge and a right edge of a rear portion of the housing body 520 and may extend in a lengthwise direction of the housing body 520. As the fixing rib 525 extends in a direction perpendicular to a direction of the installation guide 523, the fixing rib 525 divides a space defined between the pair of installation guides 523 into a plurality of smaller spaces. As the plurality of smaller spaces are each formed in a size corresponding to a size of the elastic member 720, the plurality of smaller spaces may be defined as elastic member accommodation portions 526 (or accommodation recess) which accommodate the elastic member 720. The elastic member accommodation portion 526 is formed in a size for accommodating a bottom surface of the elastic member 720, that is, one surface of the extension portion 722 and the pair of support portions 721. The fixing rib 525 may protrude in a height equal to a height of a protrusion height of the installation guide 523.

Because a distance between outer surfaces of the pair of installation guides 523 corresponds to a width of the sensor PCB 700, the edges at a rear surface of the sensor PCB 700 may be supported by the pair of installation guides 523. Further, a distance between inner surfaces of the installation guides 523 may be equal to or slightly greater than a width of the elastic member 720. Thus, the elastic member 720 may be positioned in an inner region of the installation guide 523, and an inner surface of the pair of installation guides 523 supports a left and a right surface of the elastic member 720. As a result, when the elastic member 720 is compressed by a pressure of a user's touch, the elastic member 720 may be prevented from being twisted or inclined in a left or right direction, and the sensor PCB 700 may be stably supported.

As illustrated in FIG. 17A, a distance L2 between the pair of fixing ribs 525 forming the elastic member accommodation portion 526 may be less than a distance L1 between outer surfaces of the pair of support portions 721. Further, a distance between the installation guides 523 which define the elastic member accommodation portion 526 and face each other may also be less than a width of the elastic member 720. As illustrated in FIG. 17B, the elastic member 720 may be slightly greater than a size of the elastic member accommodation portion 526, and may be press-fitted and mounted inside the elastic member accommodation portion 526.

When the elastic member 720 is mounted in the elastic member accommodation portion 526, there is a merit in which the elastic member 720 is not separated from the elastic member accommodation portion 526 even when an additional adhesive member is not used. In addition, even when a touch pressure is applied by an operation of the touch operation unit 12, the sensor PCB 700 may be stably supported and an elastic force may be provided toward the sensor PCB 700. In addition, even when the touch pressure is repeatedly transferred to the elastic member 720 for extended period of time, an installation position of the elastic member 720 may be maintained. The lateral and vertical widths of the elastic member accommodation portion 526 may be smaller than lateral and vertical widths of the elastic member 720 by about 0.2 mm in consideration of a hardness of the elastic member 720.

Referring to FIGS. 18 to 21, the sensor PCB 700 may be formed of a plastic material. A copper coating or film 712 (a conductive layer) is used to print a circuit on a front surface (a top surface in the drawing) of an insulating substrate of the sensor PCB 700. The sensor 750 for sensing a movement or spatial displacement of the front panel 20 based on a user's touch input is provided at the front surface of the sensor PCB 700. As can be appreciated, other electrically conductive material may be used instead of the copper coating or film.

The sensor 750 may be a piezo sensor, and may include a metal plate 751, and a ceramic element or disc 752 attached on a front surface of the metal plate or disc 751 (a top surface in the drawing). The metal plate 751 is elastically deformed by touch pressure generated when a user touches the front surface of the front panel 20. The ceramic element 752 generates electricity based on the touch pressure. The piezo sensor is a pressure sensing sensor known to one of ordinary skill in the art, and a detailed description regarding the principle of the piezo sensor is omitted. Although the sensor 750 having a circular shape is exemplified, the sensor 750 may not be limited to the circular shape, and may be formed to have other shapes.

The sensor 750 may be formed in plural number according to the sensor PCB 700, and a sensor support portion 713 may be formed at the front surface of the sensor PCB 700 in which the sensor 750 is installed. The sensor support portion 713 may be defined as a groove or hole having a size (or a diameter) less than that of the sensor 750 (or a circular shaped sensor). Accordingly, an edge of a rear surface (or a bottom surface) of the metal plate 751 of the sensor 750 is supported by an edge of a front surface (or a top surface) of the sensor support portion 713. The sensor support portion 713 protrudes in a boss shape whose inside may be empty, that is, not a groove or hole shape, and the sensor 750 may be positioned at a top surface of the boss.

When the sensor support portion 713 and the sensor 750 have a circular shape, a diameter of the sensor support portion 713 may be formed to be less than that of the metal plate 751, and may be formed greater than that of the ceramic element 752. Accordingly, the metal plate 751 may be deformed by touch pressure applied to the front panel 20, and the ceramic element 752 may effectively sense a change of pressure applied to the sensor 750.

When the sensor support portion 713 is a hole passing through the copper coating or film and the insulating substrate rather than a groove which does not go through the insulating substrate, a cover member or a film cover 770 may be attached onto a rear surface of the sensor PCB 700 on which the sensor support portion 713 is formed. As the cover member 770 is formed to be larger than the sensor support portion 713, the cover member 770 may completely cover an opened rear surface of the sensor support portion 713. According to the above-described structure, a front surface and the rear surface of the hole-shaped sensor support portion 713 are respectively covered by the touch sensor 750 and the cover member 770.

As the cover member 770 is completely adhered to the rear surface of the sensor PCB 700 by an adhesive, airtightness inside the sensor support portion 713 may be maintained. Accordingly, the cover member 770 may prevent moisture from penetrating inside the sensor support portion 713, and may prevent corrosion of the touch sensor 750. Specifically, as the cover member 770 is attached onto the rear surface of the sensor PCB 700 in a shape of a film sheet having the same size as that of the sensor PCB 700, the cover member 770 may simultaneously cover all of a plurality of the sensor support portions 713 formed at the sensor PCB 700.

Alternatively, the number of the cover members 770 may be provided to correspond to the number of the plurality of the sensor support portions 713 formed at the sensor PCB 700. The cover member 770 may be formed in a size to allow fitting between a pair of elastic members 720 facing each other around the sensor support portion 713 so that one cover member 770 covers one sensor support portion 713.

A common contact point or common pad 714 connected by positive electrodes of a plurality of sensors 750 and the circuit is formed at one side of the sensor PCB 700. The common contact point 714 electrically connects rear surfaces of the plurality of the sensors 750. In addition, when the conductive foil 740 is adhered to a front surface of the copper coating or film 712, the common contact point 714 contacts a central conductive line 741a formed at the conductive foil 740, and is electrically connected to negative electrodes of the plurality of the sensors 750. Thus, a current flows to the sensors 750.

Installation markings 715 mark exact positions of the elastic members 720 and may be indicated at a rear surface of the sensor PCB 700. The installation markings 715 may be formed by printing or other appropriate methods. When the elastic members 720 are mounted in the installation marks 715, the elastic members 720 are mounted at correct positions. The installation positions of the elastic members 720, i.e., the positions of the installation markings 715, are formed at an outside of the sensor 750, and indicated at positions to face each other. The installation markings 715 facing each other may be formed at the same distance from a center of the sensor support portion 713.

The positions of the installation markings 715 may be at locations greater than outer ends of the sensors 750. Specifically, a separation distance L between inner lines of the installation markings 715 facing each other from the center of the sensor 750 may be defined as a distance L between inner surfaces of the pair of support portions 721 which constitute the elastic member 720. In addition the separation distance L may be greater than an external diameter of the sensor 750, specifically, the metal plate 751. Accordingly, the elastic member 720 may not be interfered with the sensor 750 in a direction in which touch pressure is transmitted, and reduction in the sensitivity of the sensor 750 may be prevented.

In addition, a plane which passes a center of each of the plurality of the sensors 750 and a plane which equally divides each of the body coupling portions 521 and each of the cover coupling portions 516 may be the same plane or aligned with each other. As shown in FIG. 14, the body coupling portion 521 and the cover coupling portion 516 may be vertically and equally divided by a horizontal plane which passes a center of the contact portion 745. Thus, uniform pressure is applied to the entire sensor PCB 700 positioned at an inside of the sensor housing 500a, and the plurality of sensors 750 may sense a user's operation signal under the same condition.

Figure 22:
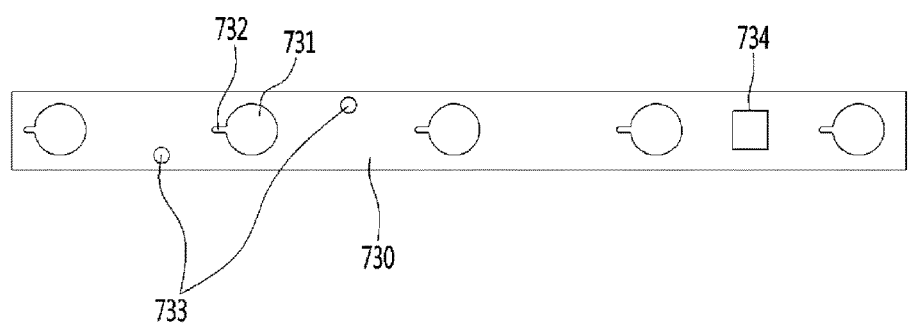
FIG. 22 is a plan view illustrating a spacer which constitutes the touch sensor assembly.

As illustrated in FIG. 22, a spacer 730 may be interposed between the copper coating or film 712 and the conductive foil 740 of the sensor PCB 700. The spacer 730 adheres the conductive foil 740 to the front surface of the sensor PCB 700, and may include an adhesive member such as a double sided tape. In addition, a plurality of holes may be formed in the spacer 730.

Specifically, when the spacer is attached at the sensor PCB 700, the holes formed at the spacer 730 may include a plurality of sensor holes 731 formed at positions corresponding to the sensors 750, and a contact hole 734 may be formed at a position corresponding to the common contact point 714 of the copper coating or film 712. When the conductive foil 740 is attached to a front surface (or a top surface) of the spacer 730 by the holes, the conductive foil 740 may contact the sensor 750 and the common contact point 714. The sensor hole 731 may have a size greater than the diameter of the sensor 750, and the sensor 750 may be accommodated within the sensor hole 731. When the sensor 750 is deformed by touch pressure, the sensor is not interfered by the spacer 730.

In addition, bent holes or air escape holes 732 may be respectively formed at edges of the sensor holes 731. When the spacer 730 is attached on the copper coating or film 712, the bent holes 732 serve as a path through which bubbles present between the spacer 730 and the copper coating or film 712 are readily discharged to the outside. The bent hole 732 extends from an edge of the sensor hole 731 to a predetermined length in a prescribed direction, e.g., lengthwise direction, of the spacer 730. The prescribed direction is based on the shape of the spacer 730 and how the film spacer 730 is attached to the copper coating or film 712, e.g., the filmed shaped spacer 730 of the present disclosure is sequentially attached from one end of the copper coating or film 712 toward an opposite end of the copper coating or film 712 in a lengthwise direction. Accordingly, the bent hole 732 may extend from the edge of the sensor hole 731 in the same direction as a direction toward which the spacer 730 is attached in a predetermined length.

In addition, when the spacer 730 and the conductive foil 740 are attached on the copper coating or film 712, guide portions may be provided at the spacer 730 and the conductive foil 740 so that the spacer 730 and the conductive foil 740 are attached to correct positions. For example, the guide portion may include alignment through holes 733 and 744 provided at the spacer 730 and the conductive foil 740. The alignment through holes 733 and 744 may be formed in plural number in a lengthwise direction of the spacer 730 and the conductive foil 740, and may be alternately disposed at one side edge and the other side edge in a widthwise direction of the spacer 730 and the conductive foil 740.

In the sensor PCB 700, alignment rods 760 are disposed at positions corresponding to the through holes 733 and 744. When the spacer 730 and the conductive foil 740 are attached to the sensor PCB 700, the alignment rods 760 pass through the through holes 733 and 744. After the spacer 730 and the conductive foil 740 are sequentially attached to the sensor PCB 700, the alignment rods 760 may be removed from the sensor PCB 700. According to the above-described process, the spacer 730 and the conductive foil 740 may be attached at correct positions on the sensor PCB 700 by the guide portion such that the center of the sensor 750 may match a center of the sensor hole 731 of the spacer 730. In addition, the center of the sensor 750 may match a center of the contact portion 745 of the conductive foil 740 provided at the sensor PCB 700.

Figure 23:
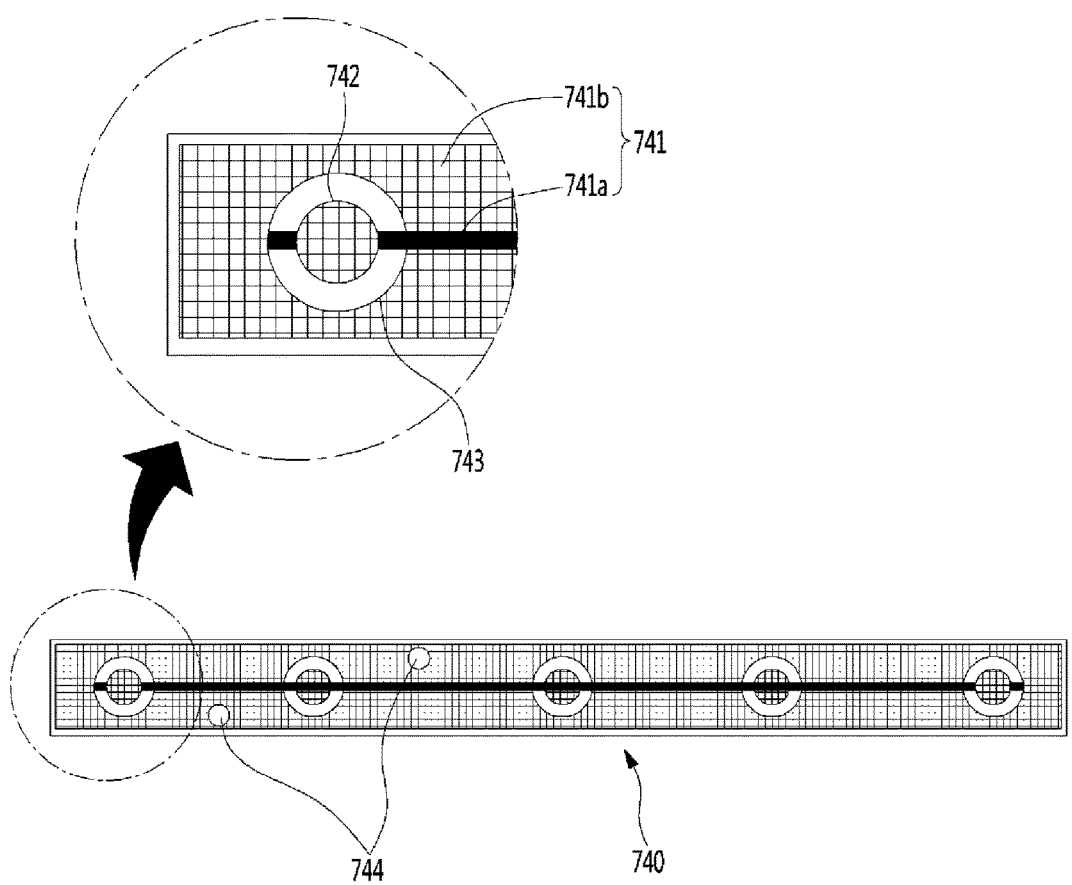
FIG. 23 is a plan view illustrating a conductive foil which constitutes the touch sensor assembly.

Referring to FIG. 23, the conductive foil 740 may include a transparent resin film material such as polyethylene terephthalate (PET), and may be formed to have a size corresponding to the sensor PCB 700 and the spacer 730. A conductive line 741, which commonly connects top surfaces of the plurality of touch sensors 750 and the common contact point 714 formed at the copper coating or film 712, may be formed at a rear surface (or a bottom surface) of the conductive foil 740. The conductive line 741 may be printed using a silver material at a rear surface of the conductive foil 740.

In addition, a surface in which the conductive line 741 is printed is formed to extend to contact a front surface (or a top surface) of the spacer 730 and to simultaneously contact the touch sensor 750 and the common contact point 714. The conductive line 741 may include the central conductive line 741a and a peripheral conductive line 741b. The central conductive line 741a extends from a center of the conductive foil 740 in a lengthwise direction of the conductive foil 740, and a peripheral conductive line 741b is connected to the central conductive line 741a and is formed to extend in a grid shape or mesh shape over an entire surface of the conductive foil 740. The central conductive line 741a may contact all of a top surface of the touch sensor 750 and the common contact point 714.

An inner guide line 742 may be formed in a circular shape at the rear surface of the conductive foil 740 and enable correct position for touch sensor 750 attachment. The peripheral conductive line 741b having the grid shape may also be formed at an inside of the inner guide line 742. In addition, the central conductive line 741a is connected to the inner guide line 742. An outer guide line 743 having a diameter greater than a diameter of the inner guide line 742 may be formed at an outside of the inner guide line 742. The inner guide line 742 and the outer guide line 743 are also a part of the peripheral conductive line 741b having the grid shape, and may include a silver material. The inner guide line 742 and the outer line 743 are bisected by the central conductive line.

The inner guide line 742 may be formed to correspond to a size of the ceramic element 752, and the outer guide line 743 may be formed to correspond to a size of the metal plate 751. Accordingly, in a state in which the touch sensor 750 is installed at a correct position, an edge of the ceramic element 752 may positioned to contact the inner guide line 742 and an edge of the metal plate 751 may be positioned to contact the outer guide line 743.

The central conductive line 741a extends from a center of the rear surface of the conductive foil 740 in a lengthwise direction of the conductive foil 740, and connects a plurality of outer guide lines 743 and inner guide lines 742. The conductive line 741 connects the common contact point 714 and the top surface of the touch sensor 750, that is, a negative electrode, and thus an electric current may be applied to the touch sensor 750.

When a signal is generated by a touch input, a noise may be reduced by the peripheral conductive line 741b having the grid shape or mesh shape. Since a conductive line having a grid shape is not formed between the outer guide line 743 and the inner guide line 742, when the front panel 20 is pushed and deformed, deformation of the front panel 20 may be effectively transmitted to the touch sensor 750.

Figure 24:
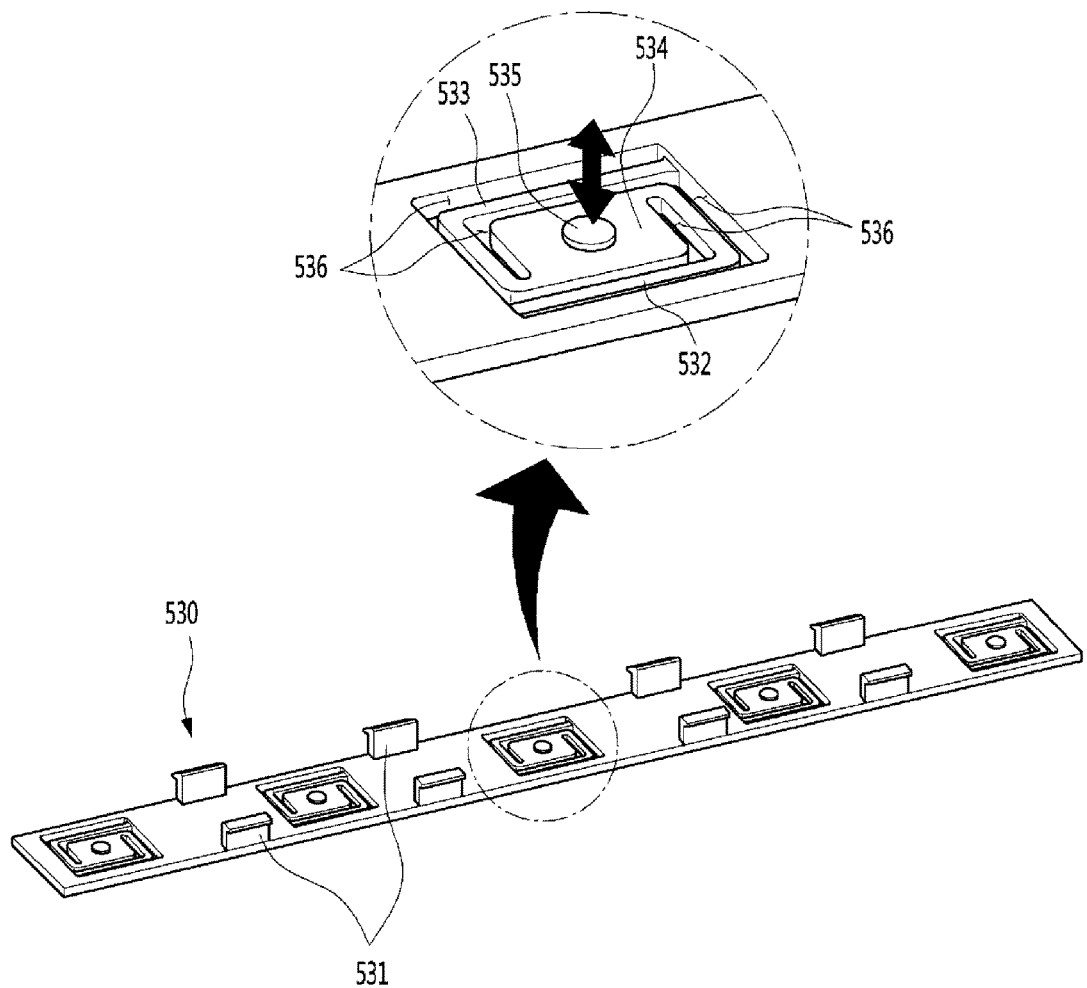
FIG. 24 is a perspective view illustrating a rear surface of a touch booster which constitutes the touch sensor assembly.

Referring to FIG. 24, the touch booster 530 may be formed to have a size corresponding to the opening 512 of the housing cover 510, and formed to cover the opening 512. In addition, a plurality of hooks or clips 531 formed at left and right sides of the touch booster 530 are coupled to the hook grooves 514 formed at the housing cover 510. In addition, the hooks 531 are configured to allow forward or backward movement inside the hook groove 514.

In addition, a plurality of elastic deformation portions or buttons corresponding to the number of the sensors 750 may be formed at the touch booster 530. The elastic deformation portions are formed at positions corresponding to positions of the touch operation units 12 and the sensors 750 of the front panel 20, and has elasticity to allow deformation in a rearward direction, and to move in a forward direction based on a restorative force. When a user pushes the touch operation unit 12, the touch operation unit 12 moves backward according to deformation of the front panel 20, and presses the elastic deformation portion. In addition, the elastic deformation portion presses the sensor 750. When a user releases the touch input from the touch operation unit 12, the elastic deformation portion returns to the original position.

The elastic deformation portion may include a first extension 532 which extends from an edge of one side of an opening formed at the touch booster 530 and is bent, a second extension 533 which extends from an edge of the other side of the opening and is bent, and a common portion or region 534 which is disposed at a center of the opening to connect end portions of the first extension 532 and the second extension 533. The second extension portion 533 may extend from a side opposite to the first extension portion 532.

The first extension 532 and the second extension 533 may be configured to have a narrow width, to extend, to be bent at least one time, and to be elastically deformable so that the common portion 534 moves in a direction of pressure and returns to the original position. The first extension 532 and the second extension 533 may extend and be bent along an edge of the common portion 534, and may be symmetrically formed with respect to a plane which passes a diagonal line of the common portion 534.

A remainder except the first extension 532, the second extension 533, and the common portion 534 forms a cut portion or a cut-out 536. The protrusive portion 535 may be formed to extend at a rear surface of the common portion 534. The protrusive portion 535 is positioned at a center of the rear surface of the common portion 534, and is aligned with a center of the sensor 750. The protrusive portion 535 is also formed to maintain a contact state with an upper surface of the conductive foil 740. Accordingly, when the common portion 534 is moved backward, a central portion of the sensor 750 is pressed by the contact portion 745.

Figure 25:
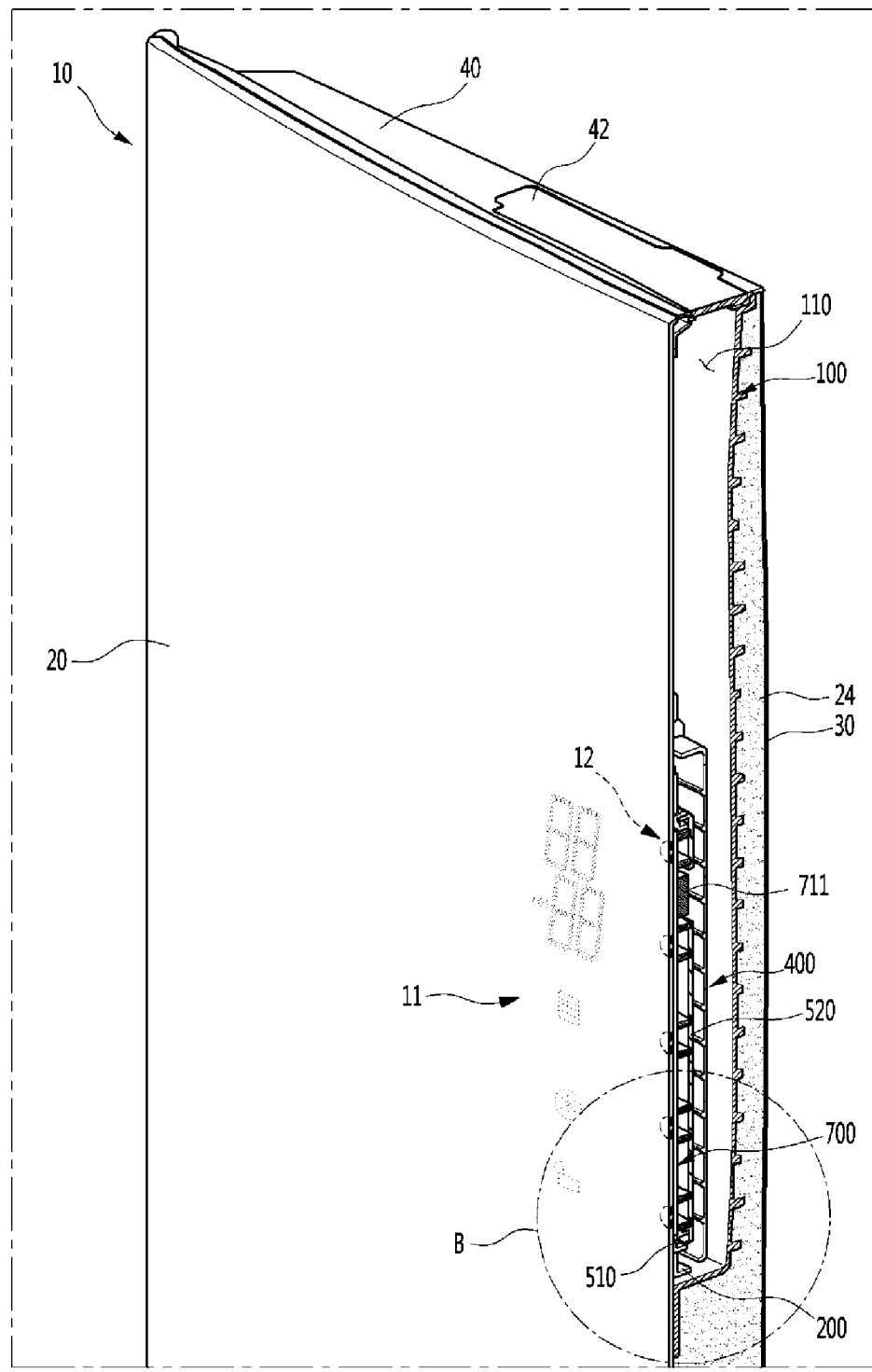
FIG. 25 is a cut away perspective view taken along line 25-25' of FIG. 2.
Figure 26:
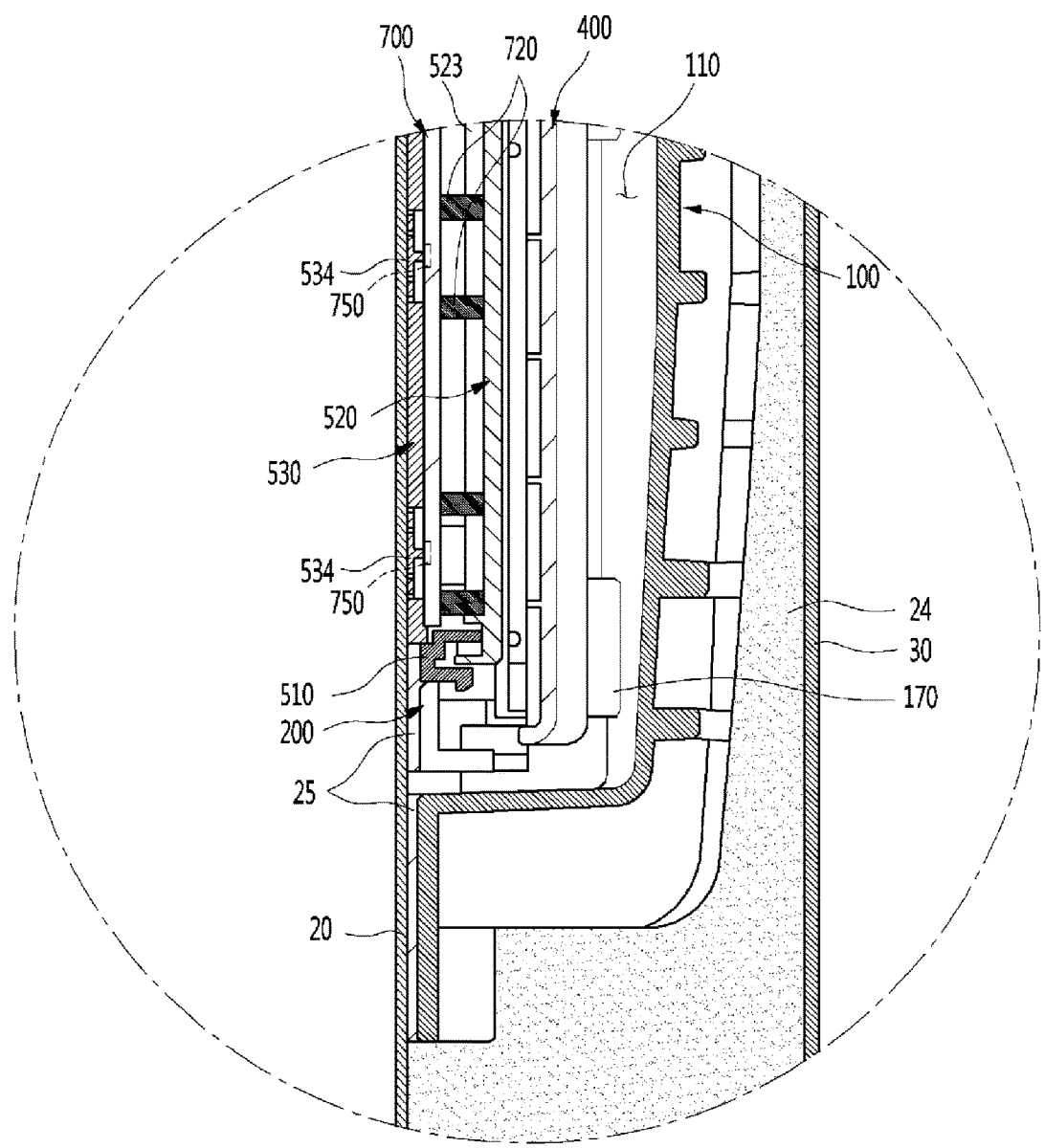
FIG. 26 is an enlarged view illustrating a B portion of FIG. 25.
Figure 27:
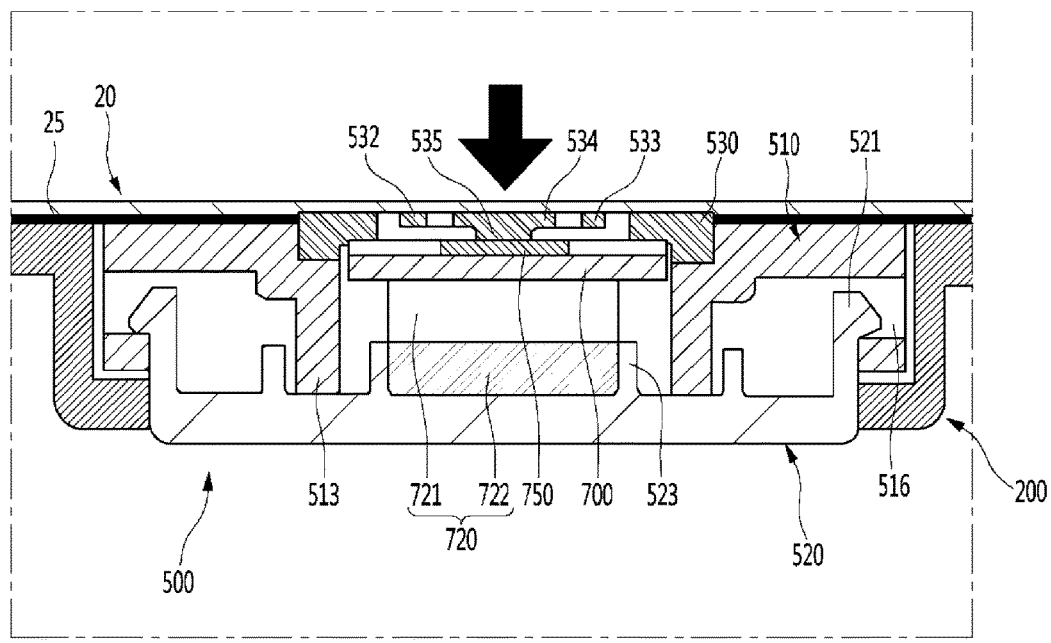
FIG. 27 is an enlarged view illustrating a C portion of FIG. 7.

Referring to FIGS. 25 to 27, the touch sensor assembly 500 is attached to the front panel 20 where the touch sensor assembly 500 is installed at the display cover 200. As the adhesive members 25 is provided to the front surface of the display cover 200 and the front surface of the housing cover 510, the display cover 200 and the touch sensor assembly 500 may be adhered to the rear surface of the front panel 20.

The adhesive member 25 is not provided to the touch booster 530, and the touch booster 530 is simply pressed or fitted against the rear surface of the front panel 20. When the touch sensor assembly 500 is installed at the display cover 200 and the touch sensor assembly 500 is attached to the rear surface of the front panel 20, the touch booster 530 moves backward and the elastic member 720 is compressed based on the touch input on the front panel. The sensor PCB 700 is pressed forward by a restoring force of the elastic member 720, and as a result, the sensor PCB 700 is pressed against the touch booster 530. In addition, the touch booster 530 may be moved forward or backward by touch pressure when the touch booster 530 is coupled to the housing cover 510.

In the above-described state, when a user touches the touch operation unit 12 of the front panel 20, a movement displacement of the front panel 20 is generated at a region on which the front panel 20 is touched. The movement displacement of the front panel 20 is immediately transmitted through the touch booster 530 to press the sensor 750. As a result, a touch signal is generated from the sensor 750, and a controller of the refrigerator senses a user's touch operation.

As the touch booster 530 moves backward by a user's touch of the front panel 20, the elastic member 720 may be increasingly compressed. When touch input is removed from the touch operation unit 12, the sensor PCB 700 and the touch booster 530 move forward and return to a previous state by a restoring force of the elastic member 720, the elastic deformation portion of the touch booster 530, and the metal plate 751 of the sensor 750. The elastic member 720 configured to press and support the sensor PCB 700 may be formed to have various shapes to provide uniform pressure to the sensor PCB 700 when the sensor housing is coupled thereto.

Figure 28:
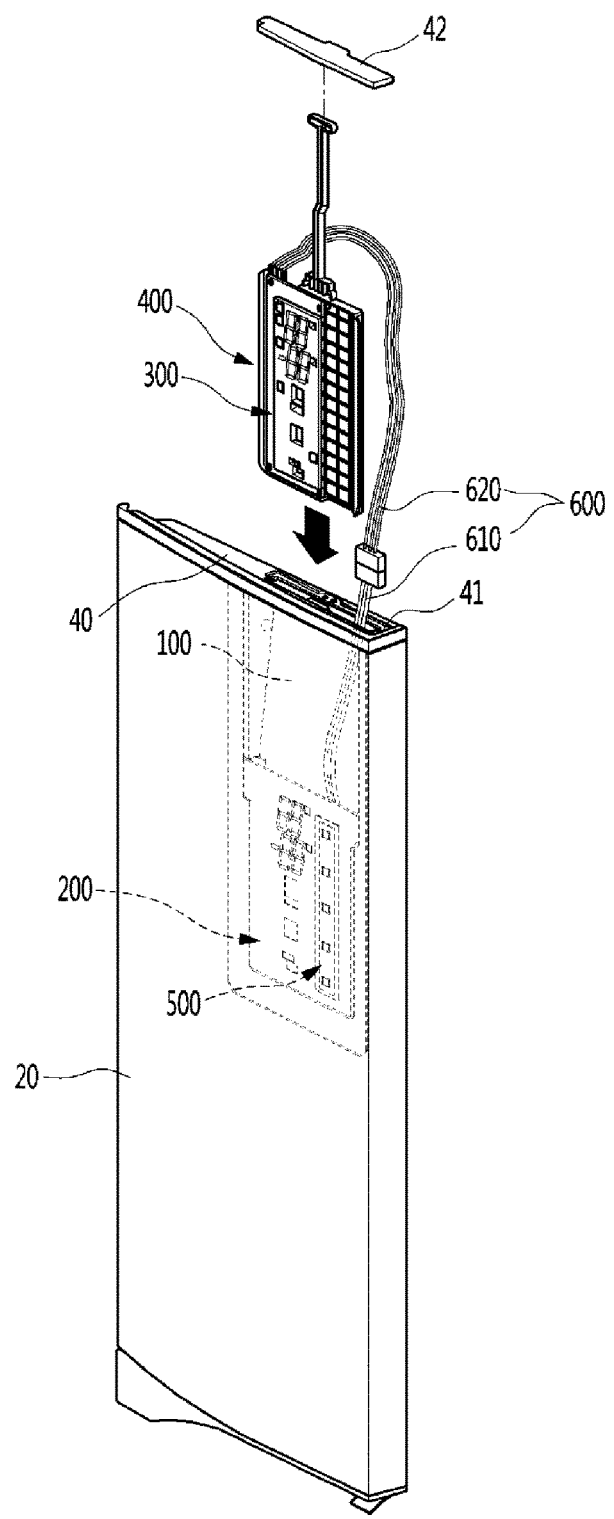
FIG. 28 is an exploded perspective view illustrating an installation process of the display assembly.

Referring to FIG. 28, the front panel 20 is formed of a plate-shaped stainless steel to manufacture the door 10. The plurality of first through holes 21 which constitute the display window 11 may be formed at the front panel 20 using an etching or a laser processing. The first through holes 21 may be filled with the sealing member 22, and the diffusive sheet 26 may be attached to the rear surface of the front panel 20 in which the first through holes 21 are formed (see FIG. 13). In addition, the touch operation unit 12 may be formed at the front panel 20 using an etching, a surface processing, or a printing.

When the front panel 20 is completely formed, the touch sensor assembly 500 is assembled. In order to assemble the touch sensor assembly 500, the elastic member 720 is attached to the rear surface of the sensor PCB 700, and the spacer 730 is attached to the front surface thereof. The sensor 750 is positioned at the sensor support portion 713 formed at the sensor PCB 700, and the conductive foil 740 is adhered thereto. In addition, a cover member 770 which covers a rear end opening of the sensor support portion 713 and seals an inside of the sensor support portion 713 is adhered to the rear surface of the sensor PCB 700.

In order to adhere the spacer 730 and the conductive foil 740, the alignment rod (not shown) is disposed at a predetermined position of the sensor PCB 700, and the spacer 730 is attached where a through hole 733 passes through the alignment rod of the spacer 730. Accordingly, the spacer 730 may be attached to a correct position on the top surface of the sensor PCB 700.

The spacer 730 is attached thereto in a direction toward which the bent hole 732 extends, and bubbles generated while the spacer 730 is attached may be discharged through the bent hole 732. When the spacer 730 is completely attached thereto, the conductive foil 740 is attached to a top surface of the spacer 730.

Like the spacer 730, the through hole 744 is attached thereto to pass through the alignment rod, the conductive foil 740 is attached to a correct position, and the conductive foil 740 and the spacer 730 are aligned accurately. As the conductive foil 740 is gradually attached thereto from an end portion of one side in the direction toward which the bent hole 732 extends, bubbles are not trapped in the conductive foil 740 and the spacer 730. When the conductive foil 740 is attached to a correct position, an edge of an outside of the sensor 750 is correctly interposed between the inner guide line 742 and the outer guide line 743.

After the above-described processes, the sensor PCB 700 is accommodated in the housing body 520, and the housing cover 510 in which the touch booster 530 is installed is coupled to the housing body 520. When the housing cover 510 and the housing body 520 are coupled, the elastic member 720 is compressed, the sensor PCB 700 is pressed, and as a result, the sensor PCB 700 is pressed against the touch booster 530. The touch booster 530 is installed thereto to move forward or backward, and the front surface of the touch booster 530 protrudes more than the front surface of the housing cover 510.

The completely assembled touch sensor assembly 500 is seated on the accommodation portion 210 of the display cover 200, the housing coupling portion 511 is coupled to an edge of an upper side of the accommodation portion 210, and a state in which the touch sensor assembly 500 is fixed to the display cover 200 is maintained. After the adhesive member 25 is attached to the front surfaces of the display cover 200 and the housing cover 510, the display cover 200 and the touch sensor assembly 500 are simultaneously attached to the rear surface of the front panel 20.

When the display cover 200 is attached to the front panel 20, the frame 100 is fixed to the front panel 20 so that the display cover 200 is accommodated therein. In addition, the door liner 30 is coupled to the rear surface of the front panel, and the deco members 40 are coupled to upper ends of the front panel 20 and the door liner 30. Thereafter, a foam solution is foamed inside of the door 10, and the heat insulating material 24 is formed. The heat insulating material 24 fills an entire inner space of the door 10 except an inside of the frame 100, and stably fixes the frame 100.

In a state in which the heat insulating material 24 is completely formed in an inside of the door 10, the display assembly 300 is installed at the display frame 400. A worker also connects the first cable connector 610 connected to the sensor PCB 700 and the second cable connector 620 connected to the display PCB 310. Because the connection between the first cable connector 610 and the second cable connector 620 is performed after the heat insulating material 24 is completely formed, possible damage of the sensor controller 330 caused by static electricity generated while the heat insulating material is formed by foaming a foam solution may be prevented.

After the first cable connector 610 and the second cable connector 620 are connected to each other, the display frame 400 is installed in the inside of the door 10 through the insertion hole 41, and the display frame 400 is completely inserted into the display cover 200 using the frame handle 420. After complete insertion, the display assembly 300 is completely pressed against the rear surface of the display cover 200. In addition, the first through hole 21, the second through hole 220, and the third through hole 321 are aligned and communicated with each other from front to back.

After the display frame 400 is completely inserted, the insertion hole cover 42 is installed at the insertion hole 41, and the insertion hole 41 is closed. In addition, the upper end of the frame handle 420 is fixed by the insertion hole cover 42, and the door 10 is completely manufactured.

The door according to the embodiment of the present disclosure may not be limited to the above-describe embodiment, and other embodiments may be suggested. In another embodiment of the present disclosure, a touch booster is directly attached to the display cover, a housing body is coupled to the display cover, and a space which accommodates a sensor PCB is formed.

Another embodiment of the present disclosure has the same structure except structures of a display cover and a touch sensor assembly, and the same reference number refers to the same component in the drawings. Redundant description thereof will be omitted.

Figure 29:
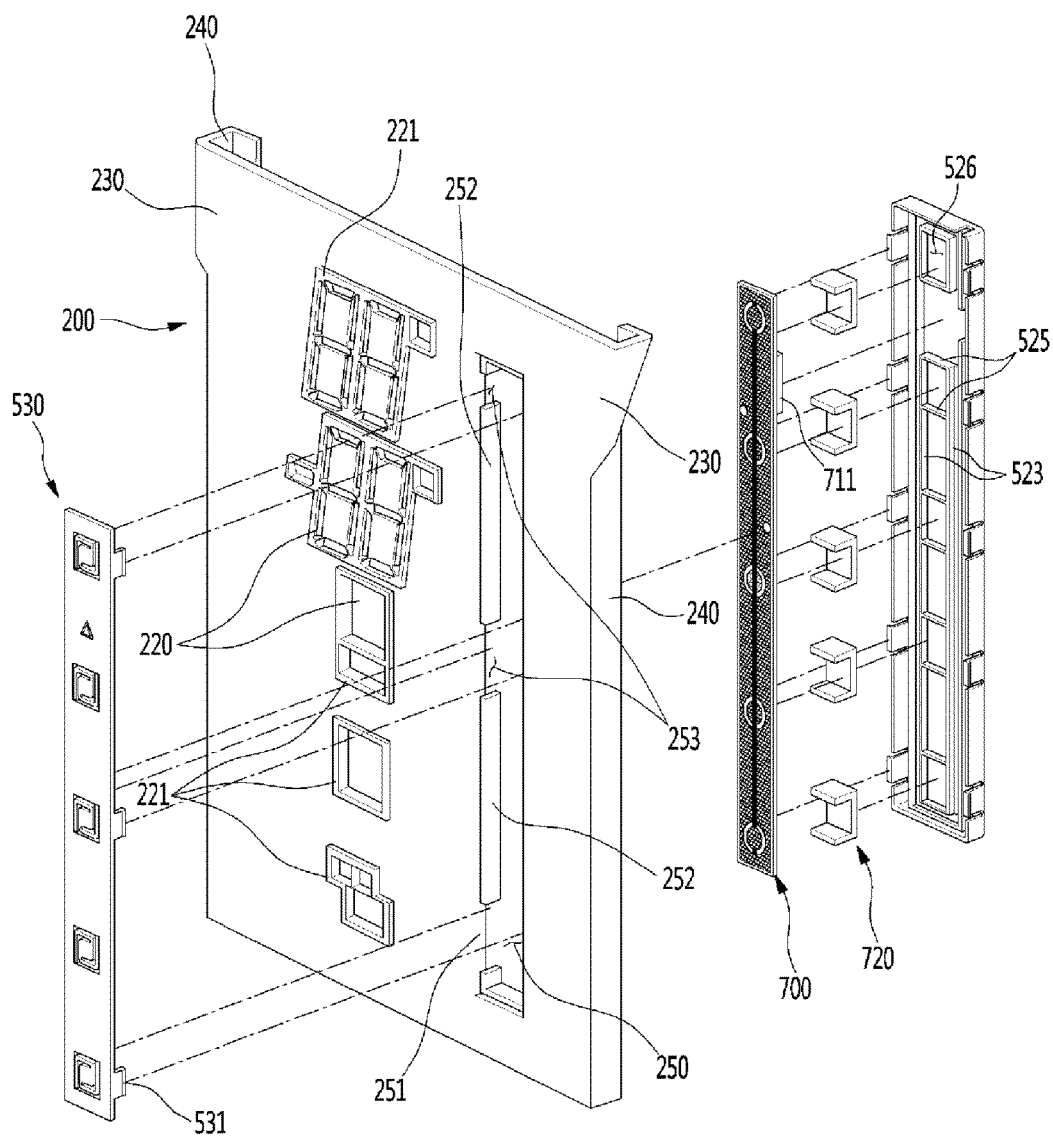
FIG. 29 is an exploded perspective view illustrating a structure of a display cover and a sensor housing according to another embodiment of the present disclosure.

FIG. 29 is an exploded perspective view illustrating a structure of a display cover and a sensor housing according to another embodiment of the present disclosure. A display cover 200 is attached to a rear surface of a front panel 20 of a door 10 according to another embodiment of the present disclosure, and a touch sensor assembly 500 including a touch booster 530, a sensor PCB 700, and a housing body 520 is coupled to the display cover 200.

A plurality of second through holes 220 are formed in one side of the display cover 200, and a booster insertion portion 250 is formed at the other side thereof which is spaced in a side direction from a region in which the second through holes 220 are formed. The booster insertion portion 250 is opened to have a size corresponding to the touch booster 530. An extending rib 251 may be formed to extend backward at an edge of the booster insertion portion 250, and the extending rib 251 guides a forward and backward movement of the touch booster 530.

An extending rib may also be formed to extend backward at an edge of the accommodation portion 210 of the display cover 200 according to the previous embodiment of the present disclosure. Unlike the extending rib 251, the extending rib which extends backward from both sides of the accommodation portion 210 may support a side portion of the touch sensor assembly 500.

A booster support portion 252 protrudes and extends from an inner circumferential surface of the booster insertion portion 250 and is configured to support the touch booster 530 from a backward direction. The booster support portion 252 may be formed in the same shape as the booster support portion 513 in FIG. 14, and may perform the same function.

A part of the booster support portion 252 is cut, and forms a hook groove 253 like the hook groove 514 in FIG. 14. In addition, a hook 531 formed at both sides of the touch booster 530 moves backward along the hook groove 253, and is hooked on a rear side of the extending rib 251. The hook groove 253 may be completely opened backward, and the touch booster 530 may move forward or backward by touch pressure.

The housing body 520 is coupled to a rear side of the booster insertion portion 250. The housing body 520 is coupled to a rear surface of the display cover 200, and forms a space which accommodates the sensor PCB 700. To this end, a plurality of body coupling portions 521 are formed at left and right sides of the housing body 520, and the plurality of body coupling portions 521 may be formed in a hook shape. Coupling portions configured to be coupled to the body coupling portion 521 may be formed at the rear surface of the display cover 200 corresponding to the body coupling portion 521.

An installation guide 523 configured to guide a plurality of elastic members 720 which support the sensor PCB 700 is formed to protrude and extend at an inside of the housing body 520 in a rib shape. As already described in FIG. 14, the installation guide 523 enables the elastic members 720 not to be inclined in one direction when the elastic members 720 are compressed.

Touch sensors 750 are disposed at a front surface of the sensor PCB 700, and a spacer 730 and a conductive foil 740 are sequentially adhered to the front surface of the sensor PCB 700 in which the touch sensors 750 are disposed. As described in the previously, since the touch sensor 750 covers a front surface of the sensor support portion 713 formed at the sensor PCB 700, and the cover member 770 covers the rear surface of the sensor support portion 713, airtightness of the sensor support portion 713 may be maintained.

The sensor PCB 700 is accommodated in an inside of the housing body 520, and is pressed by the elastic members 720 when the housing body 520 is coupled to the display cover 200. The sensor PCB 700 moves forward and the front surface thereof contacts the touch booster 530, and a front surface of the touch booster 530 protrudes more than a front surface of the display cover 200. As a result, a state in which the touch booster 530 is strongly pressed against a rear surface of the front panel 20 may be maintained.

Adhesive members 25 may be provided at a remaining part of the display cover 200 except the booster insertion portion 250 in a state in which the touch sensor assembly 500 is coupled to the display cover 200. In addition, the display cover 200 is attached to the rear surface of the front panel 20 using the adhesive members 25. Here, even though the touch booster 530 is not adhered to the front panel 20, a state in which the touch booster 530 is always pressed against the front panel 20 is maintained.

In addition, a state in which an end portion of the protrusive portion 535 of the touch booster 530 always contacts a front surface of the conductive foil 740 is maintained, and a state in which a surface opposite the front surface of the conductive foil 740 which contacts the protrusive portion 535 is pressed against the touch sensor 750 is maintained. Accordingly, a displacement generated during a touch operation of a touch operation unit 12 may be immediately transmitted through the protrusive portion 535 and the contact portion 745 to the touch sensor 750.

Meanwhile, the touch sensor assembly according to one embodiment may not be only provided at the door according to the previous embodiment, but may also be provided at refrigerators having various types. As a touch sensor assembly which will be described below has the same structure as the above-described touch sensor assembly, the same reference number refers to the same component in the drawings. Redundant description thereof will be omitted.

Figure 30:
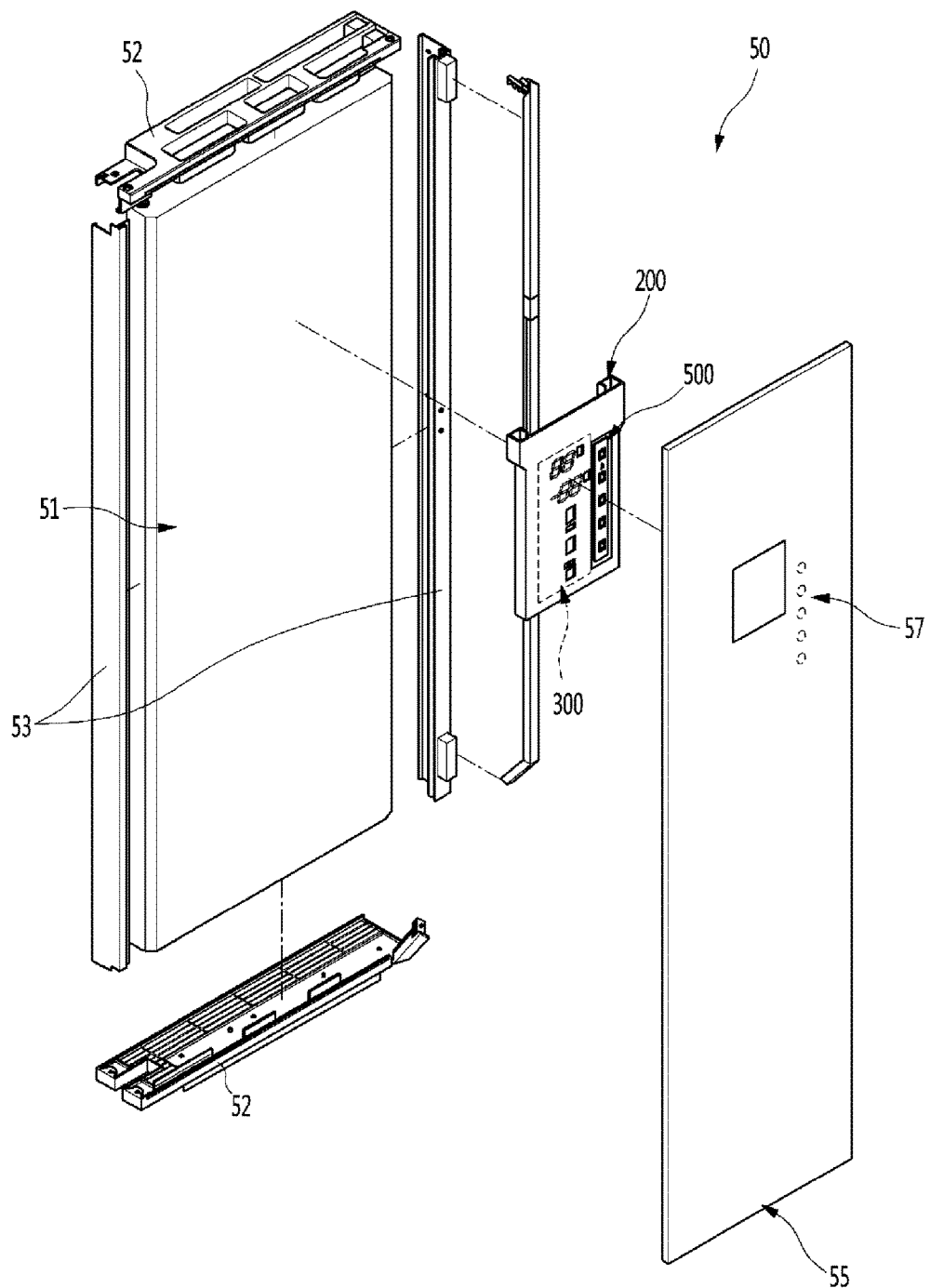
FIG. 30 is an exploded perspective view illustrating a structure in which the touch sensor assembly according to one embodiment of the present disclosure is mounted in a different type of door.

FIG. 30 is an exploded perspective view illustrating a structure in which the touch sensor assembly according to one embodiment of the present disclosure is installed at a door having another type. A door 50 in which a touch sensor assembly 500 is installed may include a door case 51 in which a heat insulating material is accommodated, a pair of cap decos 52 disposed at upper and lower sides of the door case 51, a pair of side decos 53 disposed at left and right sides of the door case 51 and coupled to a door handle 54, and a front panel 55 coupled to a front surface of the door case 51. The front panel 55 may be fixed to the front surface of the door case 51 by the pair of cap decos 52 and the side decos 53.

The front panel 55 may be formed of tempered glass or a plastic material, and a film may be printed on a front surface of the front panel 55. A display window 56 showing an operation state of a refrigerator may be formed at the front panel 55, and a touch operation unit 57 may be formed at one side of the display window 56. The display window 56 may be formed in a transparent or translucent type to see therethrough. The touch operation unit or area 57 may be formed using a printing or a surface processing. The display window 56 and the touch operation unit 57 are the same as the display window 11 and the touch operation unit 12 described in the previous embodiment.

A display cover 200 may be adhered and fixed to a rear surface of the front panel 55 corresponding to a rear side of the display window 56. As described in the previous embodiment, the touch sensor assembly 500 and a display assembly 300 may be mounted on the display cover 200. According to the present embodiment, the display cover 200 is independently interposed between the door case 51 and the front panel 55 without a frame 100. To this end, the front panel 55 is spaced a distance corresponding to a thickness of the display cover 200 from the front surface of the door case 51 by the cap decos 52 and the side decos 53.

When the display cover 200 is attached to the rear surface of the front panel 55, light output from the display assembly 300 may be emitted through the display window 56 to the outside, and an operation state of the refrigerator may be shown to the outside. The touch sensor assembly 500 is pressed against a rear surface of the touch operation unit 57, and recognizes the touch operation when a user touches the touch operation unit 57.

Figure 31:
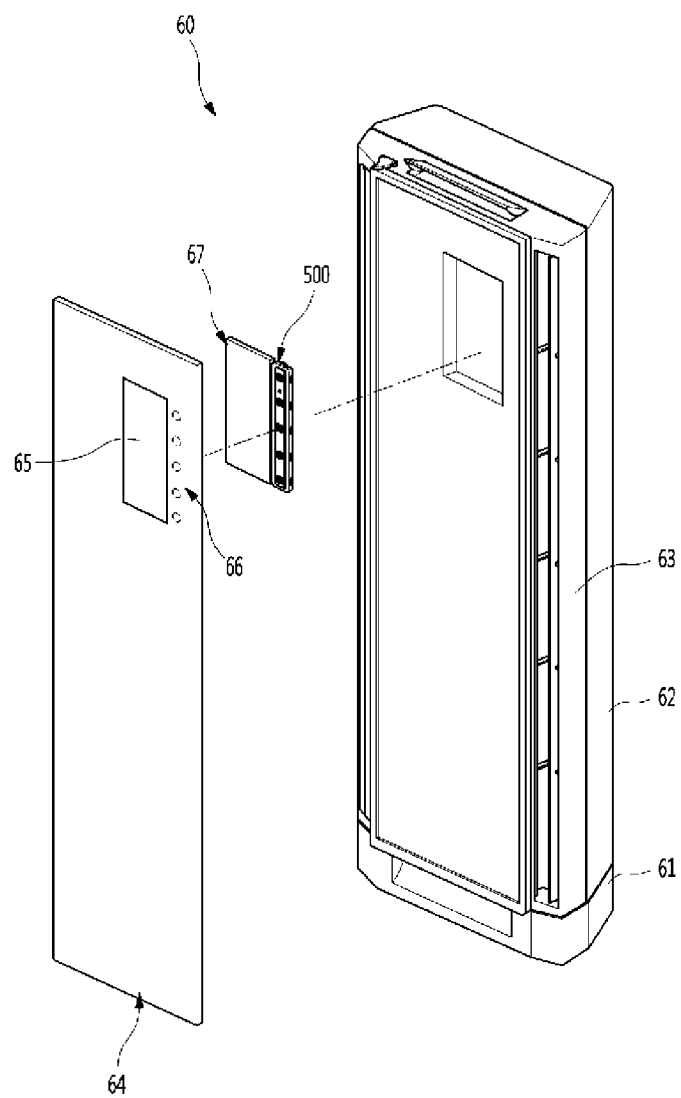
FIG. 31 is an exploded perspective view illustrating a structure in which the touch sensor assembly according to one embodiment of the present disclosure is mounted in an air conditioner.

FIG. 31 is an exploded perspective view illustrating a structure in which the touch sensor assembly according to one embodiment of the present disclosure is installed at an air conditioner. An indoor unit 60 of an air conditioner which includes a touch sensor assembly 500 includes a base 61, a rear cabinet 62 disposed at a rear side of a top surface of the base 61, and a front cabinet 63 disposed at a front side of the top surface of the base 61. In addition, an exterior member 64 may be disposed at a front surface of the front cabinet 63.

The base 61, the rear cabinet 62, and the front cabinet 63 are coupled to each other, and form a predetermined space. A blower fan and a flow path configured to draw in or discharge air are provided in the space, and a filter assembly configured to filter drawn-in air, and a compressor, a condenser, an expansion valve, and an evaporator which constitute a freezing cycle are accommodated in the space.

The indoor unit 60 may include a intake hole 631 which draws in indoor air, and a plurality of discharging holes 632 through which the sucked air through the intake hole 631 exchanges heat using the evaporator and is discharged to an interior.

The exterior member 64 may be pivotably and detachably installed at the front cabinet 63. Hinges 601 may be installed at upper and lower ends of the front cabinet 63, and the hinge may be inserted into top and bottom surfaces of side end portions of the exterior member 64. The exterior member 64 may be pivotably connected to the front cabinet 63 by the hinges 601. Further, the exterior member 64 may be separated from the hinges 601.

A front side of the front cabinet 63 may be opened by pivoting or detaching of the exterior member 64, and maintenance and repair of electric components provided at the front cabinet 63 may be performed. Alternatively, the exterior member 64 may be fixed and installed to the front cabinet 63.

A transparent display window 65 configured to show an operation state of the air conditioner may be formed at the exterior member 64, and a touch operation unit or touch input area 66 may be indicated at one side of the display window 65 by a printing or a surface processing. A display assembly 67 may be provided in the rear of the display window 65, and as light emitted from the display assembly 67 passes through the display window 65 to the outside, operation information of the indoor unit may be shown. The display assembly 67 may be constituted by a combination of LEDs, may also provide information in a numeral or symbol type, and may also provide information using pictures or images by being constituted by liquid crystal displays (LCDs) theretogether.

The touch sensor assembly 500 may be attached at a rear surface of the exterior member 64 corresponding to the touch operation unit 66. The touch sensor assembly 500 is adhered by an adhesive member such as an adhesive or double sided tape, and the touch sensor assembly 500 may be pressed against the touch operation unit 66 and recognize a user's touch operation.

Figure 32:
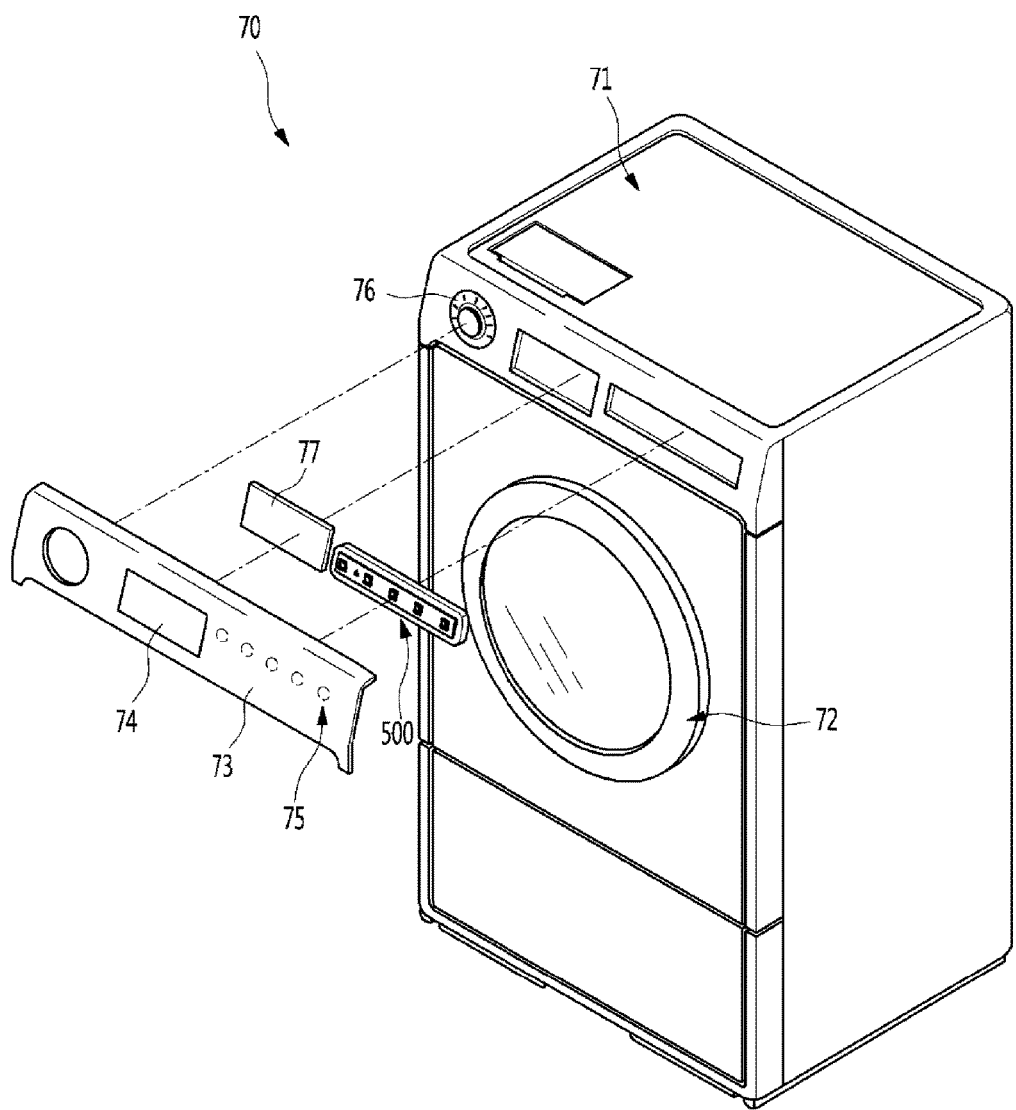
FIG. 32 is an exploded perspective view illustrating a structure in which the touch sensor assembly according to one embodiment of the present disclosure is mounted in a washing machine.

FIG. 32 is an exploded perspective view illustrating a structure in which the touch sensor assembly according to one embodiment of the present disclosure is installed at a washing machine. A washing machine 70 which includes a touch sensor assembly 500 may include a main body 71 forming an exterior, a tub which is accommodated in the main body 71 and stores wash water, a drum which is disposed in an inside of the tub and accommodates laundries, a driving unit which transmits a rotating force for rotating the drum, a wash water supplying unit which supplies the wash water to the tub, and a discharging unit configured to discharge the wash water.

A part of a front surface of the main body 71 is formed to be open to put the laundries into the drum, and an opening of the main body 71 is opened or closed by a door 72. The door 72 is pivotably installed at the main body 71. An exterior member 73 having a plate shape may be provided at an upper side of a front surface of the main body 71 except the door 72. In addition, a display window 74 and a touch operation unit or a touch input area 75 may be formed at the exterior member 73.

The display window 74 shows an operation state of the washing machine 70, and an operation and operation option of the washing machine 70 may be selected by touch operation of the touch operation unit 75. A knob 76 having a dial shape for operation of the washing machine 70 may be provided at the front surface of the main body 71, and the knob 76 may pass through the exterior member 73 and be exposed to the outside.

A display assembly 77 may be provided in the rear of the display window 74, light may be emitted to the display window 74 by the display assembly 77, and operation information of the washing machine 70 may be displayed. The display assembly 77 may be formed with a combination of LEDs, may also provide information in a numeral or symbol type, and may also provide information using pictures or images by being formed with liquid crystal displays (LCDs) theretogether.

The touch sensor assembly 500 may be attached to a rear surface of the exterior member 73 corresponding to the touch operation unit 75. The touch sensor assembly 500 may be adhered by an adhesive member such as an adhesive or a double sided tape, and the touch sensor assembly 500 may be pressed against the touch operation unit 75, and may recognize a user's touch operation.

Figure 33:
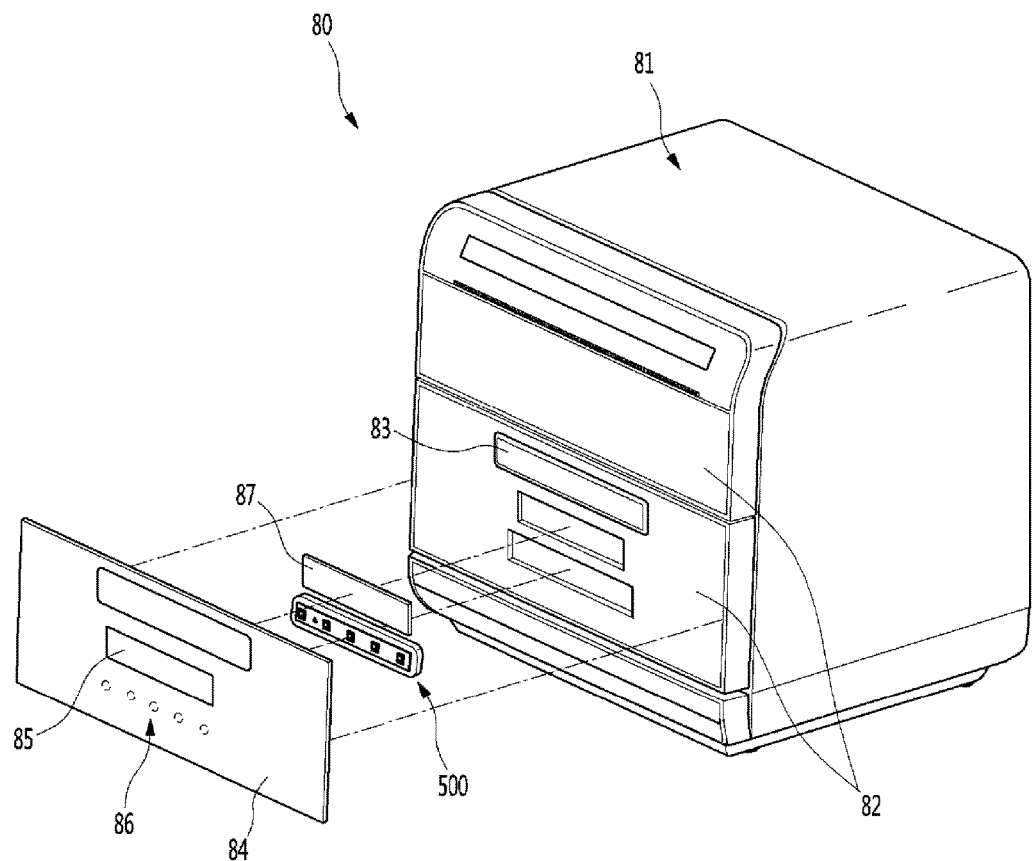
FIG. 33 is an exploded perspective view illustrating a structure in which the touch sensor assembly according to one embodiment of the present disclosure is mounted in a dishwasher.

FIG. 33 is an exploded perspective view illustrating a structure in which the touch sensor assembly according to one embodiment of the present disclosure is installed at a dishwasher. An exterior of a dishwasher 80 including a touch sensor assembly 500 is formed by a main body 81 formed in a roughly rectangular hexahedron shape. Within an inside of the main body 81, a cavity which accommodates dishes to wash, rack members which are inserted into or withdrawn from the cavity and in which the dishes are seated, a water supplying unit which supplies wash water to an inside thereof to wash, a discharging unit which discharges the used wash water, and the like may be included.

Doors 82 may be provided at the dishwasher main body 81. The doors 82 are configured to selectively cover an opened front surface of the main body 81, and form an exterior of a front side of the dishwasher 80 in a state in which the doors 82 are closed. The doors 82 may be formed with an upper door and a lower door, and when the lower door operates, the upper door may be opened or closed in conjunction therewith. A handle 83 configured to open or close the doors 82 may be provided at the lower door.

Exterior members 84 which form an exterior are attached at front surfaces of the doors 82, that is, front surfaces of the upper door and the lower door. A transparent display window 85 configured to show an operation state of the dishwasher 80 may be formed at the exterior member 84, and a touch operation unit or a touch input area 86 may be provided at one side of the display window 85 by a printing or a surface processing.

A display assembly 87 may be provided in the rear of the display window 85, light may be emitted to the display window 85 by the display assembly 87, and operation information of the dishwasher 80 may be displayed. The display assembly 87 may be constituted by a combination of LEDs, may also provide information in a numeral or symbol type, and may also provide information using pictures or images by being constituted by liquid crystal displays (LCDs) theretogether.

The touch sensor assembly 500 may be attached to a rear surface of the exterior member 84 corresponding to the touch operation unit 86. The touch sensor assembly 500 may be adhered by an adhesive member such as an adhesive or a double sided tape, and the touch sensor assembly may be pressed against the touch operation unit, and may recognize a user's touch operation.

Figure 34:
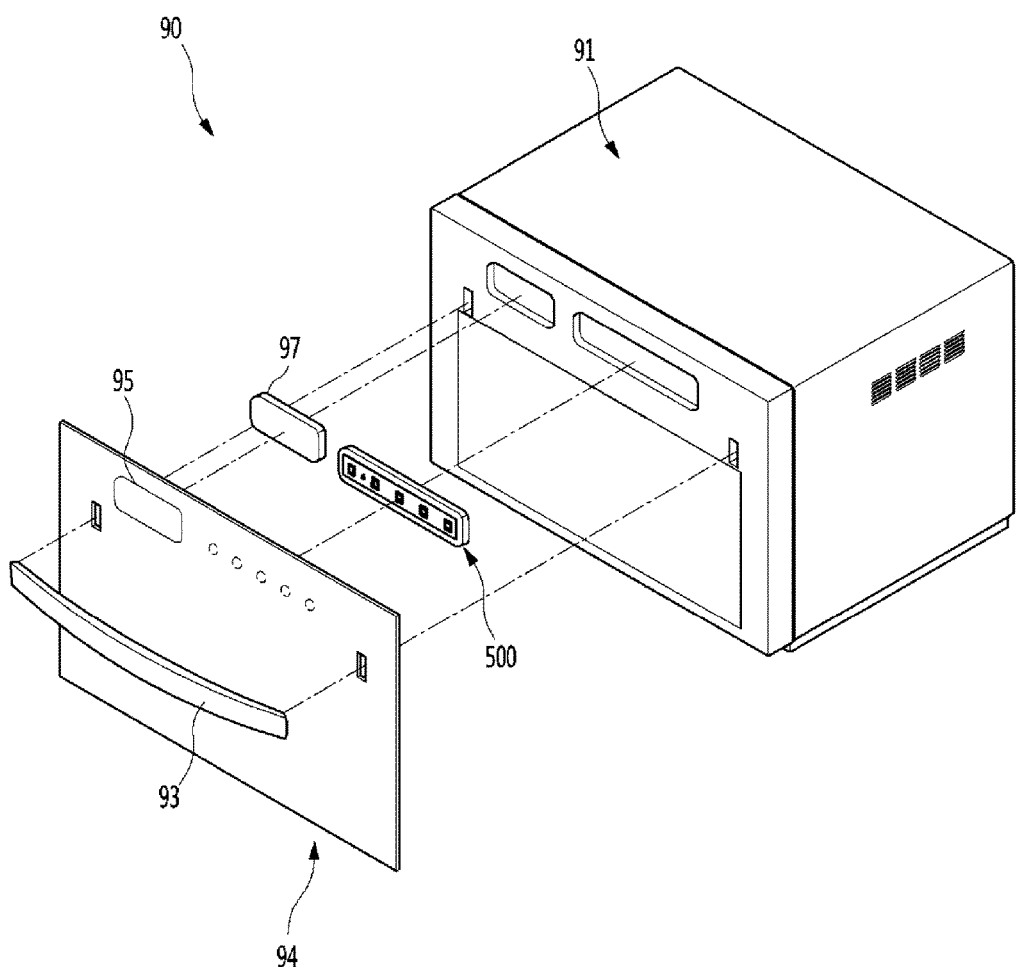
FIG. 34 is an exploded perspective view illustrating a structure in which the touch sensor assembly according to one embodiment of the present disclosure is mounted in a cooker.

FIG. 34 is an exploded perspective view illustrating a structure in which the touch sensor assembly according to one embodiment of the present disclosure is installed at a cooker. An exterior of a cooker 90 including a touch sensor assembly 500 according to an embodiment of the present disclosure is formed by a main body 91 formed in a roughly rectangular hexahedron shape. The cooker main body 91 may include a cavity which accommodates food to cook, a heating unit or magnetron configured to cook food inside the cavity, and a fan assembly which circulates air inside the cavity.

A door 92 may be pivotably provided at the cooker main body 91. The door 92 is provided to selectively cover an opened front side of the cooker main body 91, and forms a front side exterior the cooker 90 in a state in which the door 92 is closed. The door 92 may be hinge-coupled to the cooker main body 91, may be horizontally or vertically pivotable, and may selectively open or close an opened front side of the cooker 90.

A handle 93 for an opening or closing operation of the door 92 is provided at the door 92. An exterior member 94 forming a front side exterior of the door 92 may be provided at a front surface of the door 92. The exterior member 94 may also form one side of the cooker main body 91 without being limited to the door 92.

A transparent display window 95 configured to display an operation state of the cooker 90 may be formed at the exterior member 94, and a touch operation unit 96 may be formed at one side of the display window 95 by a printing or a surface processing.

A display assembly 97 may be provided in the rear of the display window 95, and operation information of the cooker may be displayed by the display assembly 97 emitting light to the display window 95. The display assembly 97 may be constituted by a combination of LEDs, may also provide information in a numeral or symbol type, and may also provide information using pictures or images by being constituted by liquid crystal displays (LCDs) theretogether.

The touch sensor assembly 500 may be attached to a rear surface of the exterior member 94 corresponding to the touch operation unit 96. The touch sensor assembly 500 may be adhered by an adhesive member such as an adhesive or a double sided tape, and the touch sensor assembly may be pressed against the touch operation unit 96, and may recognize a user's touch operation.

This application relates to U.S. application Ser. No. 14/931,776 filed on Nov. 3, 2015, and U.S. application Ser. Nos. 14/977,572, 14/977,588, 14/977,605, and 14/977,623, all filed on Dec. 21, 2015, which are hereby incorporated by reference in their entirety. Further, one of ordinary skill in the art will recognize that features disclosed in these above-noted applications may be combined in any combination with features disclosed herein.

Any reference in this specification to "one embodiment," "an embodiment," "example embodiment," etc., means that a particular feature, structure, or characteristic described in connection with the embodiment is included in at least one embodiment of the disclosure. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A household appliance, comprising:
   a cabinet having a storage space; and
   a door for opening or closing the storage space, the door including:
      a front panel formed of a metallic plate and having a display window which is defined by a plurality of first through holes and a touch input area;
      a door liner to define a rear surface of the door;
      a deco member connecting the front panel and the door liner, and having an insertion hole;
      a frame attached to a rear surface of the front panel and having an opening which communicates with the insertion hole, and also having cover support portions which protrude from side surfaces of the frame;
      a display cover attached to the rear surface of the front panel and having an accommodation portion, a plurality of second through holes, and rail guides formed at sides of the display cover;
      a touch sensor assembly provided on the accommodation portion at a position corresponding to the touch input area;
      a display frame having a mounting portion that has a plate shape and sliding insertion portions formed at sides of the mounting portion, the sliding insertion portions configured to be slid in the rail guides when the display frame is inserted in the insertion hole of the deco member;
      a display assembly coupled to the mounting portion and having a display printed circuit board (PCB) and a plurality of light-emitting diodes (LEDs), wherein, when the touch input area of the front panel is touched by a user, the display cover is pressed against the cover support portions.

2. The household appliance according to claim 1, wherein the cover support portions are arranged along the frame in a longitudinal direction and spaced apart from each other.

3. The household appliance according to claim 1, further comprising at least one protrusive portion which protrudes from a surface of each of the cover support portions to contact the rail guide of the display cover.

4. The household appliance according to claim 3, wherein the protrusive portion is formed in a rib shape or hemisphere shape.

5. The household appliance according to claim 1, further comprising a plurality of bosses protruding from the mounting portion and on which the display PCB is provided.

6. The household appliance according to claim 1, further comprising a support plate provided on an upper region of a front side of the frame.

7. The household appliance according to claim 6, wherein plate support portions are formed at sides of the front side of the frame.

8. The household appliance according to claim 1, wherein the accommodation portion includes an opening.

9. The household appliance according to claim 8, wherein housing support portions extend backward from the display cover to define the opening of the accommodation portion, and wherein an end of at least one housing support portion is bent to press against a rear surface of the touch sensor assembly.

10. The household appliance according to claim 1, further comprising a frame handle extending upward from an upper end of the display frame.

11. The household appliance according to claim 1, further comprising a heat insulating material filled in a space between the door liner and the front panel, wherein the heat insulating material is configured to surround an outer surface of the frame.

12. The household appliance according to claim 1, further comprising a reflector attached to a front surface of the display PCB, wherein a plurality of third through holes are formed in the reflector at positions aligned with the first and second through holes.

13. A household appliance, comprising:
    a cabinet; and
    a door configured to open or close the cabinet, the door including:
       a front panel having a plurality of holes and a touch input area;
       a door liner;
       a door trim connecting the front panel and the door liner, the door trim having an insertion hole;
       a frame provided between the front panel and the door liner and having a first opening communicating with the insertion hole, and also having at least one support which protrudes from the frame;
       a display cover provided between the front panel and the door liner, a plurality of holes, and rail guides formed at sides of the display cover;
       a touch sensor assembly provided on the display cover and behind the touch input area;
       a display frame having rails formed at sides of the display frame, the rails configured to be slid in the rail guides when the display frame is inserted in the insertion hole;
       a display assembly coupled to the display frame and having a first printed circuit board (PCB) and a plurality of light-emitting diodes (LEDs), wherein, when the touch input area is touched, the display cover is pressed against the at least one support.

14. The household appliance of claim 13, wherein a surface of the support that contacts the display cover is textured to include ribs or hemisphere-shaped bumps.

15. The household appliance according to claim 13, wherein a plurality of supports are arranged along an inner side of the frame to protrude into the first opening.

16. The household appliance according to claim 13, further comprising a plurality of bosses protruding from the display frame and a plurality of screws configured to fasten to the bosses to fix the first PCB to the display frame in a state where the first PCB is spaced apart from the display frame.

17. The household appliance according to claim 13, wherein the touch sensor assembly is provided in a second opening of the display cover, and housing supports extend from an edge of the second opening to maintain the touch sensor assembly in the second opening.

18. The household appliance according to claim 13, wherein the display cover has a plurality of holes provided at positions corresponding to the plurality of holes in the front panel, and wherein the display assembly includes a reflector provided over the first PCB and having a plurality of holes provided at positions corresponding to the plurality of holes in the front panel and the display cover such that light emitted from the LEDs is emitted to an outside of the front panel.

19. The household appliance according to claim 13, wherein the touch sensor assembly is provided in a second opening of the display cover such that front surfaces of the touch sensor assembly and the display cover are flush with each other.

20. The household appliance according to claim 12, wherein the touch sensor assembly has a second PCB.

21. The household appliance according to claim 12, further comprising a support plate coupled to the frame and provided between the display frame and the frame, wherein the display cover is adhered to a rear surface of the front panel, the display assembly is fixed to the display frame, and a handle extends upward from the display frame to slide the display frame into and out of the insertion hole.

* * * * *